US012794197B2

(12) United States Patent
Suzuki et al.

(10) Patent No.: US 12,794,197 B2
(45) Date of Patent: Nov. 10, 2026

(54) OPTICAL SEMICONDUCTOR DEVICE

(71) Applicant: Mitsubishi Electric Corporation, Tokyo (JP)

(72) Inventors: Ryoko Suzuki, Tokyo (JP); Keisuke Matsumoto, Tokyo (JP); Naoki Nakamura, Tokyo (JP); Ryosuke Miyagoshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 908 days.

(21) Appl. No.: 18/044,193

(22) PCT Filed: Nov. 6, 2020

(86) PCT No.: PCT/JP2020/041475

§ 371 (c)(1),
(2) Date: Mar. 6, 2023

(87) PCT Pub. No.: WO2022/097258

PCT Pub. Date: May 12, 2022

(65) Prior Publication Data

US 2023/0327405 A1 Oct. 12, 2023

(51) Int. Cl.
*H01S 5/227* (2006.01)
*H01S 5/024* (2006.01)
(Continued)

(52) U.S. Cl.
CPC ........ *H01S 5/2232* (2013.01); *H01S 5/02469* (2013.01); *H01S 5/18344* (2013.01); *H01S 5/3213* (2013.01)

(58) Field of Classification Search
CPC .... H01S 5/227; H01S 5/2275; H01S 5/02461; H01S 5/02469; H01S 5/02476;
(Continued)

(56) References Cited

U.S. PATENT DOCUMENTS

2005/0145856 A1 7/2005 Asatsuma et al.
2006/0280215 A1 12/2006 Son et al.
2011/0121337 A1 5/2011 Shakuda

FOREIGN PATENT DOCUMENTS

CN 102545051 A 7/2012
CN 102545052 A 7/2012
(Continued)

OTHER PUBLICATIONS

International Search Report issued in PCT/JP2020/041475; mailed Jan. 19, 2021.
(Continued)

*Primary Examiner* — Tod T Van Roy
*Assistant Examiner* — Delma R Forde
(74) *Attorney, Agent, or Firm* — Studebaker Brackett PLLC

(57) ABSTRACT

An optical semiconductor device of the present disclosure comprises: a ridge structure formed on a first-conductivity-type semiconductor substrate; a buried layer buried on both side surfaces of the ridge structure; a second-conductivity-type second cladding layer and a second-conductivity-type contact layer laminated on the top of the ridge structure and the surface of the buried layer; a stripe-shaped mesa structure formed of a mesa reaching from the second-conductivity-type contact layer to the first-conductivity-type semiconductor substrate; a heat dissipation layer formed on the surface of the second-conductivity-type contact layer; a mesa protective film covering both side surfaces of the mesa structure and both end portions of the surface of the second-conductivity-type contact layer; and a second-conductivity-type-side electrode electrically connected to the second-conductivity-type contact layer.

12 Claims, 14 Drawing Sheets

240

(51) Int. Cl.
*H01S 5/183* (2006.01)
*H01S 5/223* (2006.01)
*H01S 5/32* (2006.01)

(58) Field of Classification Search
CPC ............ H01S 5/02492; H01S 5/02484; H10H 29/032; H10H 29/83; H10H 29/832; H10H 29/8321; H10H 20/032; H10H 20/83; H10H 20/831
See application file for complete search history.

(56) References Cited

FOREIGN PATENT DOCUMENTS

| | | | | | |
|---|---|---|---|---|---|
| JP | H06-232493 | A | | 8/1994 | |
| JP | H09-260772 | A | | 10/1997 | |
| JP | H09260772 | | * | 10/1997 | H01S 5/00 |
| JP | 2002-246693 | A | | 8/2002 | |
| JP | 2002246693 | | * | 8/2002 | H01L 21/205 |
| JP | 2003-347238 | A | | 12/2003 | |
| JP | 2004-022934 | A | | 1/2004 | |
| JP | 2004022934 | | * | 1/2004 | H01S 5/22 |
| JP | 2004-193232 | A | | 7/2004 | |
| JP | 2005-005468 | A | | 1/2005 | |
| JP | 2005005468 | | * | 1/2005 | H01S 5/227 |
| JP | 2006-203104 | A | | 8/2006 | |
| JP | 2007-150170 | A | | 6/2007 | |
| JP | 2007150170 | | * | 6/2007 | H01S 5/22 |
| JP | 2007-214570 | A | | 8/2007 | |
| JP | 2007214570 | | * | 8/2007 | B82Y 20/00 |
| WO | 2005/124950 | A1 | | 12/2005 | |
| WO | 2009/078482 | A1 | | 6/2009 | |

OTHER PUBLICATIONS

"Notice of Reasons for Refusal" Office Action issued in JP 2021-514145; mailed by the Japanese Patent Office on Apr. 20, 2021.
Office Action issued in TW 110134360; mailed by the Taiwan Intellectual Property Office on Sep. 21, 2022.
An Office Action; mailed by the China National Intellectual Property Administration of the People's Republic of China on Sep. 5, 2024, which corresponds to Chinese Patent Application No. 202080106480.3 and is related to U.S. Appl. No. 18/044,193.

* cited by examiner

210

230

240

OPTICAL SEMICONDUCTOR DEVICE

TECHNICAL FIELD

The present disclosure relates to an optical semiconductor device.

BACKGROUND ART

A rapid increase in traffic in recent years has led to a marked increase in the speed of optical communications, which requires high-speed operation of semiconductor lasers (optical semiconductor devices). In order to achieve high-speed operation at low cost, there is a demand for direct modulation type semiconductor lasers that directly modulate distributed feedback semiconductor lasers at high speed.

To achieve high-speed operation of the semiconductor laser, it is effective to reduce parasitic capacitance and shorten a cavity length L or the like. In particular, in a buried structure with a buried layer that functions as a current block layer on both sides of an active layer, parasitic capacitance can be reduced by configuring the buried layer with semi-insulating semiconductor layers.

To further improve a relaxation oscillation frequency fr required for high-speed modulation, it is effective to shorten the cavity length L of the semiconductor laser as shown in Equation (1) below. However, the shortening of the cavity length is accompanied by a decrease in laser output power because the volume of the active layer itself, which emits a laser beam, is reduced.

[Mathematical 1]

$$fr \propto \frac{1}{2\pi}\sqrt{\frac{\Gamma}{LWdq}\cdot\frac{dg}{dn}\cdot\eta_i\cdot(I_{op}-I_{th})} \tag{1}$$

In Equation (1), Γ is an optical confinement factor, W is an active layer width, d is an active layer thickness, q is an elementary charge, dg/dn is a differential gain, $I_{op}$ is an operating current, and $I_{th}$ is a threshold current.

As a countermeasure against the above-described decrease in the laser output power, for example, as disclosed in Patent Document 1, an attempt has been made to increase the contact area between an electrode and a contact layer and reduce contact resistance therebetween in order to reduce element resistance of a semiconductor laser, thereby suppressing heat generation of the semiconductor laser and improving the laser output power.

CITATION LIST

Patent Document

Patent Document 1: Japanese Laid-Open Patent Publication No. H6-232493

SUMMARY OF THE INVENTION

Problems to be Solved by the Invention

In order to reduce the element resistance of the semiconductor laser, there is a method of reducing crystal resistance of the bulk crystal by thinning a p-type InP cladding layer, in addition to the method of reducing the contact resistance of an electrode portion by increasing the contact area between a p-type InGaAs contact layer and a p-type-side electrode as disclosed in Patent Document 1. This is because a dominant factor in the element resistance is the crystal resistance of the bulk crystal.

However, when the p-type InP cladding layer is made thinner to reduce the crystal resistance, the volume of the crystal layer for dissipating heat generated in the active layer decreases. As a result, the thinning of the p-type InP cladding layer deteriorates the heat dissipation of the semiconductor laser, which results in a significant deterioration of device characteristics, especially temperature characteristics.

The present disclosure has been made to solve the above problems, and an object of the present disclosure is to provide an optical semiconductor device with reduced element resistance and excellent heat dissipation, and a manufacturing method thereof.

Solution to the Problems

An optical semiconductor device according to the present disclosure includes: a stripe-shaped ridge structure including a first-conductivity-type cladding layer, an active layer, and a second-conductivity-type first cladding layer which are sequentially laminated on a first-conductivity-type substrate; a buried layer which is buried on both side surfaces of the ridge structure to cover thereof; a second-conductivity-type second cladding layer and a second-conductivity-type contact layer which are sequentially laminated on a top of the ridge structure and a surface of the buried layer; a stripe-shaped mesa structure which is centered on the ridge structure and formed of a mesa reaching from the second-conductivity-type contact layer to the first-conductivity-type semiconductor substrate, both side surfaces of the mesa structure being formed by the mesa; a heat dissipation layer which is provided on a surface of the second-conductivity-type contact layer and has a narrower width than the second-conductivity-type contact layer; a mesa protective film which is made of an insulating film and covers the both side surfaces of the mesa structure and both end portions of the surface of the second-conductivity-type contact layer; and a second-conductivity-type-side electrode which is electrically connected to the second-conductivity-type contact layer.

Effect of the Invention

In the optical semiconductor device according to the present disclosure, the second-conductivity-type second cladding layer can be made thinner, which enables reduction in the element resistance, whereby the heat dissipation is improved, thus exhibiting an effect of excellent high-temperature characteristics.

DESCRIPTION OF EMBODIMENTS

Embodiment 1

Figure 1:
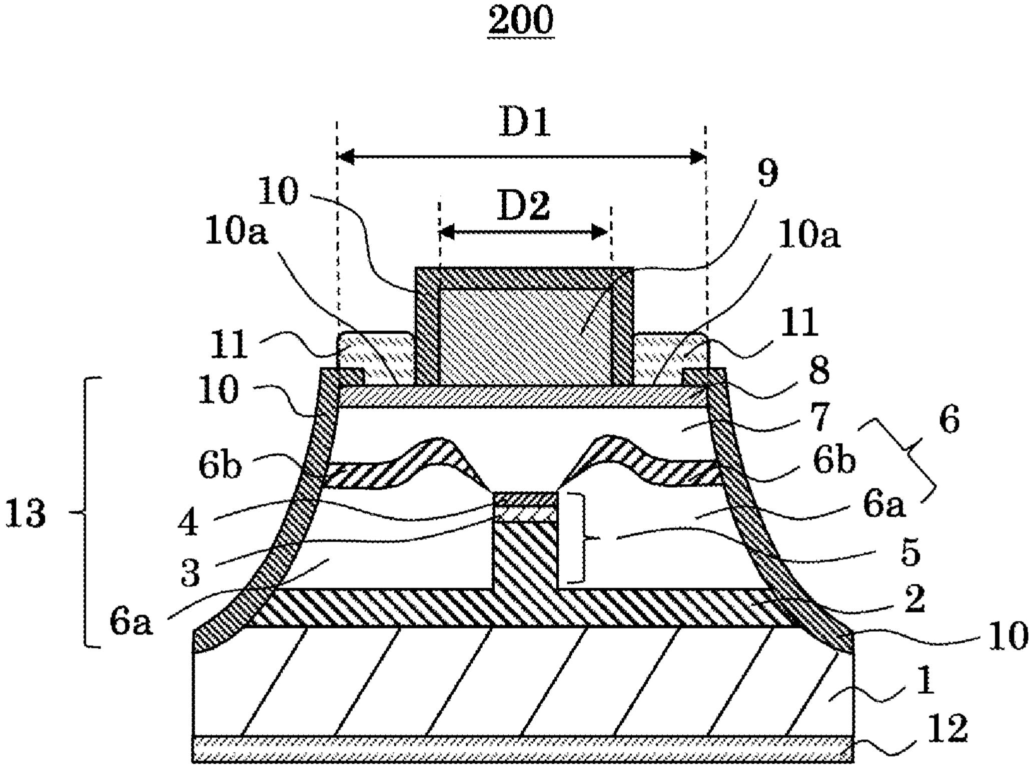
FIG. 1 is a cross-sectional view of a configuration of an optical semiconductor device according to Embodiment 1.

FIG. 1 is a cross-sectional view of an optical semiconductor device 200 according to Embodiment 1.

The optical semiconductor device 200 according to Embodiment 1 is composed of a stripe-shaped ridge structure 5 formed of an n-type InP cladding layer 2 (first-conductivity-type cladding layer), an active layer 3, and a p-type InP first cladding layer 4 (second-conductivity-type first cladding layer) which are sequentially laminated on an n-type InP substrate 1 (first-conductivity-type semiconductor substrate), a buried layer 6 formed of an Fe-doped semi-insulating InP layer 6*a* (semiconductor layer of any conductivity type) and an n-type InP block layer 6*b* (first-conductivity-type block layer) which are formed on both side surfaces of the stripe-shaped ridge structure 5, a p-type InP second cladding layer 7 (second-conductivity-type second cladding layer) and a p-type InGaAs contact layer 8 (second-conductivity-type contact layer) which are formed so as to cover a top of the stripe-shaped ridge structure 5 and a surface of the n-type InP block layer 6*b*, a p-type InP heat dissipation layer 9 (second-conductivity-type heat dissipation layer) formed on a surface of the p-type InGaAs contact layer 8, a stripe-shaped mesa structure 13 which is centered on the stripe-shaped ridge structure 5 and formed of a mesa reaching from the p-type InGaAs contact layer 8 to the n-type InP substrate 1, both side surfaces of the stripe-shaped mesa structure 13 being formed by the mesa, a mesa protective film 10 made of $SiO_2$ (mesa protective film made of an insulating film) formed so as to cover the both side surfaces of the stripe-shaped mesa structure 13 and the p-type InP heat dissipation layer 9 and both end portions of the surface of the p-type InGaAs contact layer 8, a p-type-side electrode 11 (second-conductivity-type-side electrode) provided on the surface of the p-type InGaAs contact layer 8 at both sides of the p-type InP heat dissipation layer 9, and an n-type-side electrode 12 (first-conductivity-type-side electrode) provided on a rear surface side of the n-type InP substrate 1.

Note that the Fe-doped semi-insulating InP layer 6*a* and the n-type InP block layer 6*b* are collectively referred to as the buried layer 6.

First, a manufacturing method of the optical semiconductor device 200 according to Embodiment 1 will be described below.

The n-type InP cladding layer 2, the active layer 3, and the p-type InP first cladding layer 4 are sequentially grown on a front surface of the n-type InP substrate 1 by a crystal growth method such as metalorganic vapor deposition (MOCVD) or the like (first crystal growth step).

Figure 2:
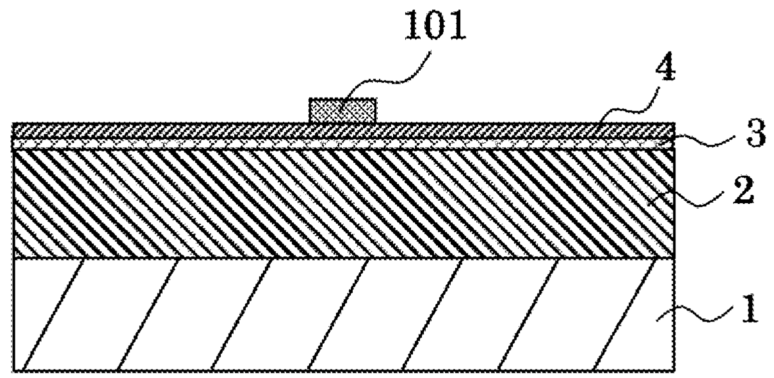
FIG. 2 is a cross-sectional view showing a manufacturing method of the optical semiconductor device according to Embodiment 1.

After the crystal growth of each of the layers mentioned above, a first $SiO_2$ film 101 is deposited on a surface of the p-type InP first cladding layer 4. The deposition method of the first $SiO_2$ film 101 is, for example, a chemical vapor deposition method (CVD) or the like. After the first $SiO_2$ film 101 is deposited, the first $SiO_2$ film 101 is patterned into a stripe shape with a desired width using photolithography and etching techniques, as shown in FIG. 2.

Figure 3:
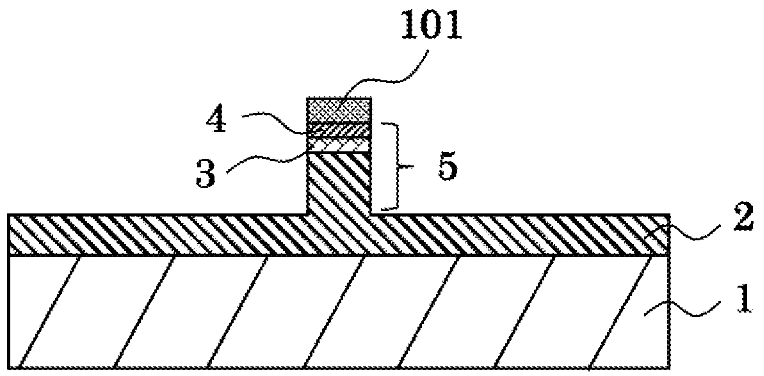
FIG. 3 is a cross-sectional view showing the manufacturing method of the optical semiconductor device according to Embodiment 1.

Subsequently, as shown in FIG. 3, using the stripe-shaped first $SiO_2$ film 101 as an etching mask, dry etching from the p-type InP first cladding layer 4 to the middle of the n-type InP cladding layer 2 or to the middle of the n-type InP substrate 1 is performed, thereby forming the stripe-shaped ridge structure 5 (ridge structure formation step). Here, the etching mask is not limited to a $SiO_2$ film, and may also be a SiN film. The etching is not limited to dry etching, and wet etching may also be used.

Figure 4:
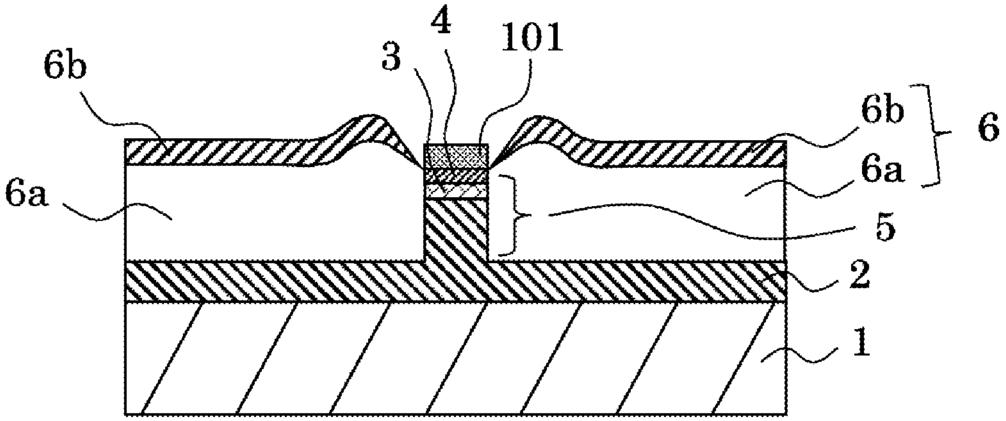
FIG. 4 is a cross-sectional view showing the manufacturing method of the optical semiconductor device according to Embodiment 1.

After the formation of the stripe-shaped ridge structure 5, as shown in FIG. 4, the buried layer 6 formed of the Fe-doped semi-insulating InP layer 6*a* and the n-type InP block layer 6*b* are buried so as to cover the both side surfaces of the stripe-shaped ridge structure 5 by the MOCVD method (second crystal growth step). In other words, the Fe-doped semi-insulating InP layer 6*a* and the n-type InP block layer 6*b* as the buried layer are formed on both side surfaces of the stripe-shaped ridge structure 5.

Note that the configuration of the buried layer 6 is not limited to such a two-layer structure, and also includes a three-layer structure sequentially laminated with a p-type InP layer, an Fe-doped semi-insulating InP layer and an n-type InP layer.

After the crystal growth of the buried layer 6, the stripe-shaped first $SiO_2$ film 101 is etched away by dry etching or the like.

Next, the p-type InP second cladding layer 7, the p-type InGaAs contact layer 8 and the p-type InP heat dissipation layer 9 are sequentially laminated by the MOCVD method so as to cover the surface of the n-type InP block layer 6*b* and the top of the stripe-shaped ridge structure 5, that is, the surface of the p-type InP first cladding layer 4 (third crystal growth step). Note that the heat dissipation layer 9 can be any p-type semiconductor layer (semiconductor layer of the second-conductivity-type) other than InP. In short, any material with excellent heat dissipation properties can be applied.

Figure 5:
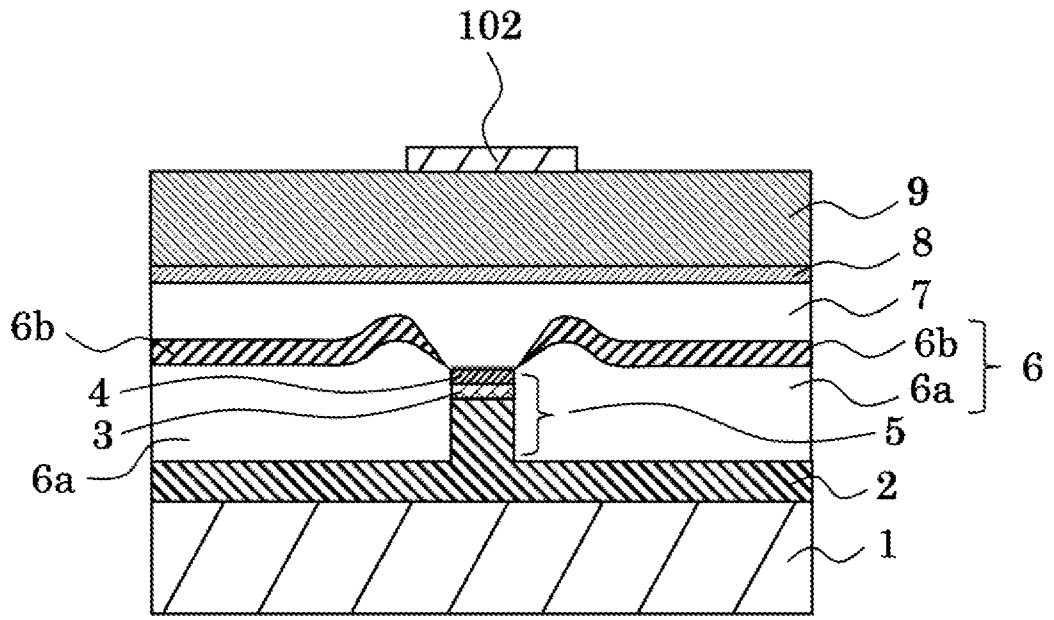
FIG. 5 is a cross-sectional view showing the manufacturing method of the optical semiconductor device according to Embodiment 1.

After the crystal growth of each of the layers mentioned above, a second $SiO_2$ film 102 is deposited on a surface of the p-type InP heat dissipation layer 9. The deposition method of the second $SiO_2$ film 102 includes, for example, the CVD method or the like. After the deposition of the second $SiO_2$ film 102, the second $SiO_2$ film 102 is patterned into a stripe shape with a desired width using photolithography and etching techniques, as shown in FIG. 5.

Figure 6:
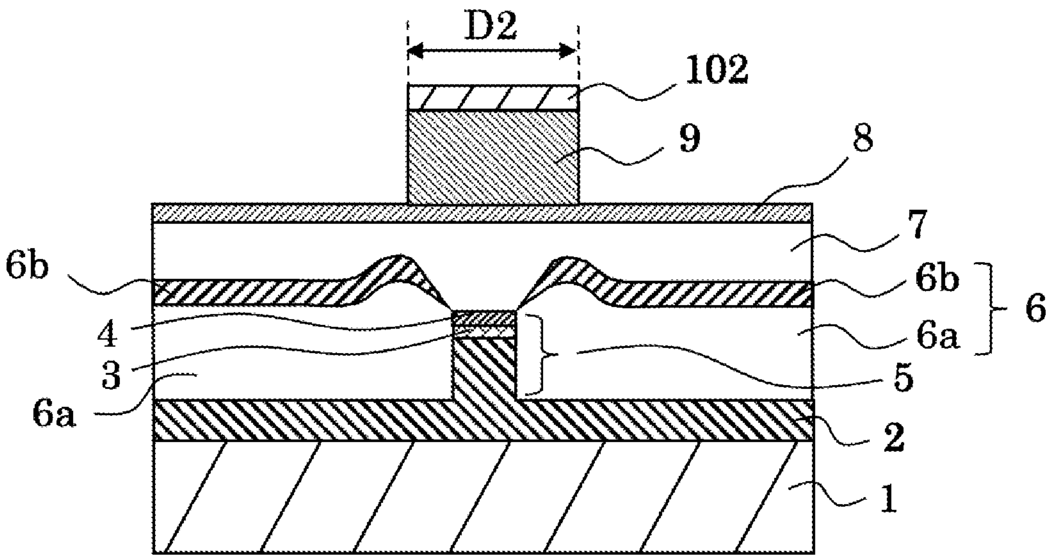
FIG. 6 is a cross-sectional view showing the manufacturing method of the optical semiconductor device according to Embodiment 1.

Subsequently, as shown in FIG. 6, using the stripe-shaped second $SiO_2$ film 102 as an etching mask, dry etching from the p-type InP heat dissipation layer 9 to the surface of the p-type InGaAs contact layer 8 is performed, so that a heat dissipation layer portion composed of the p-type InP heat dissipation layer 9 is formed (heat dissipation layer etching step).

Figure 7:
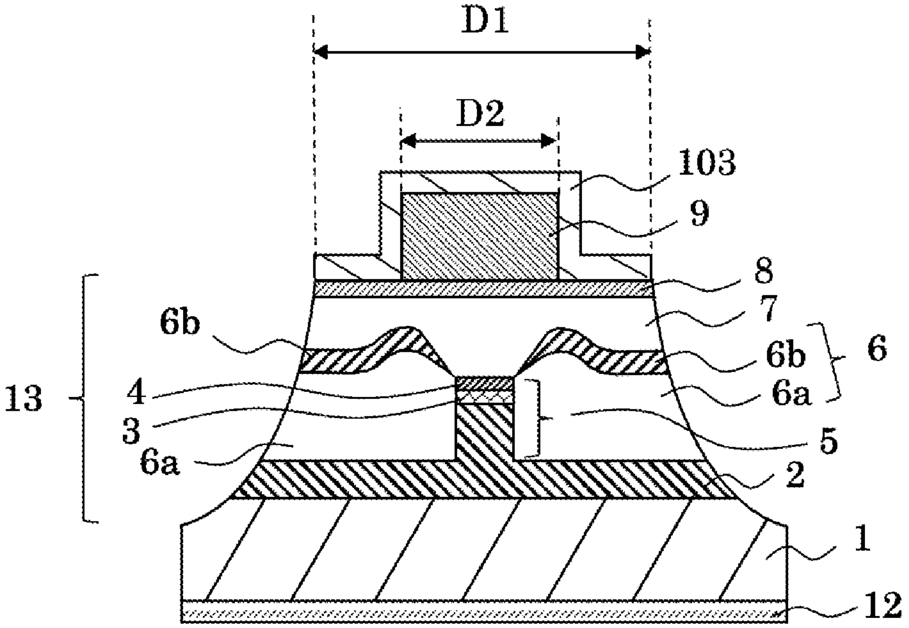
FIG. 7 is a cross-sectional view showing the manufacturing method of the optical semiconductor device according to Embodiment 1.

In this case, as shown in FIG. 7, a heat dissipation layer width D2 of the p-type InP heat dissipation layer 9 is set so that a surface mesa width D1 is larger than the heat dissipation layer width D2 in the optical semiconductor device 200. The etching mask is not limited to a $SiO_2$ film, and may also be a SiN film.

Subsequently, as shown in FIG. 7, wet etching reaching from the p-type InGaAs contact layer 8 to the n-type InP substrate 1 using a resist mask 103 is performed to form a mesa such that the stripe-shaped ridge structure 5 is centered and the surface mesa width D1 is larger than the heat dissipation layer width D2 in the optical semiconductor device 200, thereby forming a stripe-shaped mesa structure 13 in which both side thereof is formed by the mesa and the buried layer 6 is included (mesa structure formation step). Here, the etching mask is not limited to the resist, and may also be a $SiO_2$ film or a SiN film.

Note that the stripe-shaped mesa structure 13 may be a mesa structure formed in a stripe shape by performing wet etching from the p-type InGaAs contact layer 8 to the middle of any layer of the Fe-doped semi-insulating InP layer 6*a* and the n-type InP cladding layer 2.

Subsequently, a mesa protective film 10 made of $SiO_2$ is formed on the surface and both side surfaces of the stripe-shaped mesa structure 13 and the p-type InP heat dissipation layer 9 (mesa protective film formation step). Here, the mesa protective film 10 made of $SiO_2$ means the mesa protective film 10 which is made of an insulating film, namely, $SiO_2$. The deposition method of the mesa protective film 10 made of $SiO_2$ is, for example, the CVD method or the like.

Using photolithography and etching techniques, a mesa protective film opening 10*a* is provided in the mesa protective film 10 made of $SiO_2$ on the surface of the p-type InGaAs contact layer 8, where the mesa protective film 10 is deposited on both sides of the p-type InP heat dissipation layer 9. As a result of providing the mesa protective film opening 10*a* in the mesa protective film 10, the mesa protective film 10 is shaped to cover both end portions of the surface of the p-type InGaAs contact layer 8.

The p-type-side electrode 11 is formed in contact with the surface of the p-type InGaAs contact layer 8 on the both side areas of the p-type InP heat dissipation layer 9 through the portion where the mesa protective film opening 10*a* is provided (electrode formation step). The n-type-side electrode 12 is formed on a rear surface side of the n-type InP substrate 1.

By each of the above steps, the optical semiconductor device 200 according to Embodiment 1 is manufactured.

By applying the manufacturing method mentioned above to a method in manufacturing the optical semiconductor device 200 according to Embodiment 1, the element resistance is reduced and the heat dissipation is improved. As a result, it becomes possible to easily and reproducibly manufacture the optical semiconductor device 200 with excellent high-temperature characteristics.

Figure 28:
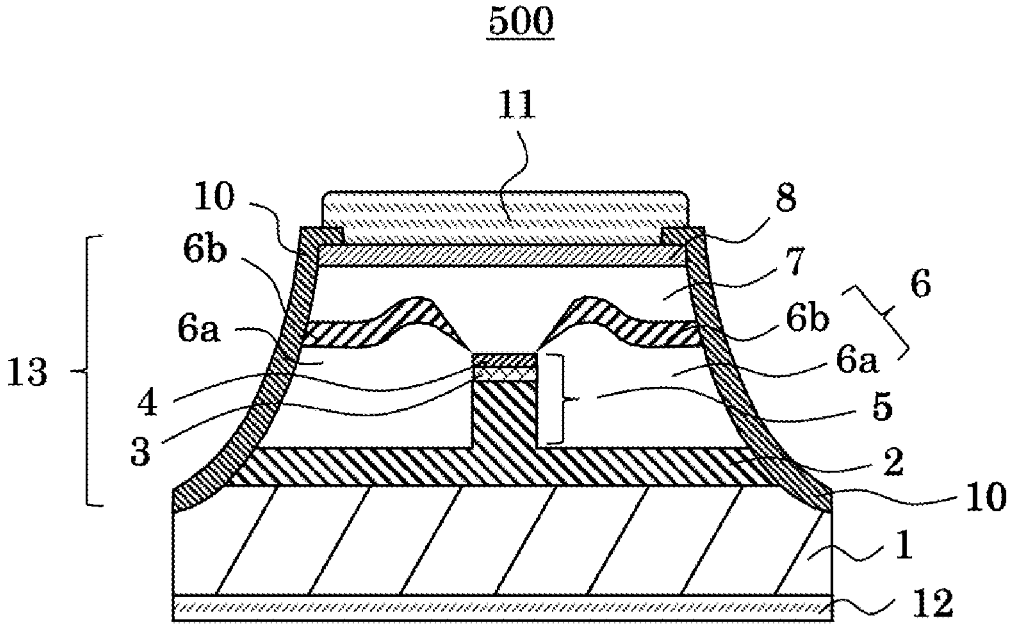
FIG. 28 is a cross-sectional view of a configuration of an optical semiconductor device according to a comparative example.

FIG. 28 shows a cross-sectional view of a structure of an optical semiconductor device 500 as a comparative example.

The optical semiconductor device 500 according to the comparative example is composed of the stripe-shaped ridge structure 5 formed of the n-type InP cladding layer 2, the active layer 3, and the p-type InP first cladding layer 4 which are sequentially laminated on the n-type InP substrate 1, the buried layer 6 formed of the Fe-doped semi-insulating InP layer 6*a* and the n-type InP block layer 6*b* which are formed on both side surfaces of the stripe-shaped ridge structure 5, the p-type InP second cladding layer 7 and the p-type InGaAs contact layer 8 which are formed so as to cover the top of the stripe-shaped ridge structure 5 and the surface of the n-type InP block layer 6*b*, the stripe-shaped mesa structure 13 which is centered on the stripe-shaped ridge structure 5 and formed of the mesa reaching from the p-type InGaAs contact layer 8 to the n-type InP substrate 1, both side surfaces of the stripe-shaped mesa structure 13 being formed by the mesa, the mesa protective film 10 made of $SiO_2$ formed so as to cover the both side surfaces of the stripe-shaped mesa structure 13 and both end portions of the surface of the p-type InGaAs contact layer 8, a p-type-side electrode 11 provided so as to cover almost whole surface of the p-type InGaAs contact layer 8, and the n-type-side electrode 12 provided on a rear surface side of the n-type InP substrate 1.

The operation of the optical semiconductor device 200 according to Embodiment 1 will be described below.

By applying a forward bias between the p-type-side electrode 11 and the n-type-side electrode 12 of the optical semiconductor device 200, current is injected through the p-type InGaAs contact layer 8. The injected current is confined in the region of the stripe-shaped ridge structure 5 by the buried layer 6, that is, the Fe-doped semi-insulating InP layer 6*a* and the n-type InP blocking layer 6*b*. With the current injected into the active layer 3, a laser beam with a wavelength corresponding to the bandgap energy of the semiconductor layer constituting the active layer 3 is generated in the active layer 3, and emitted outside the optical semiconductor device 200.

Next, the function of the p-type InP heat dissipation layer 9, which is a characteristic component in the optical semiconductor device 200 according to Embodiment 1, will be described below.

Generally, in optical semiconductor devices (semiconductor lasers), an active layer is a main heat source. Heat generated in the active layer conducts to the surrounding semiconductor layers and spreads outside the active layer.

In the optical semiconductor device 500 according to the comparative example, heat conducted in the lamination direction out of heat generated in the active layer 3 conducts from the active layer 3 to the p-type-side electrode 11 through the p-type InP second cladding layer 7 and the p-type InGaAs contact layer 8, and is dissipated to the outside of the optical semiconductor device 500.

In order to improve the heat dissipation of an optical semiconductor device, it is effective to increase the crystal volume of the p-type InP second cladding layer 7, that is, to increase the layer thickness thereof. For example, in the optical semiconductor device 500 according to the comparative example, in order to dissipate heat generated in the active layer 3, it has been necessary to make the p-type InP second cladding layer 7 thick to some extent that a necessary heat dissipation effect can be obtained. However, an increase in the thickness of the p-type InP second cladding layer 7 leads to an increase in the element resistance.

In optical semiconductor devices (semiconductor lasers), another issue is to reduce element resistance. As mentioned above, one method to reduce the element resistance is to increase the contact area between the p-type InGaAs contact layer and the p-type-side electrode, thereby reducing the contact resistance of the electrode portion. Another method is to make the p-type InP cladding layer thinner to reduce the crystal resistance of the bulk crystal, which is the dominant factor in the element resistance.

Therefore, there have been a trade-off between improving the heat dissipation and reducing the element resistance with respect to the setting of the layer thickness of the p-type InP second cladding layer 7.

To solve the above problems, in the optical semiconductor device 200 according to Embodiment 1, the p-type InP heat dissipation layer 9 is newly provided.

The p-type InP heat dissipation layer 9 which is provided on the surface of the p-type InGaAs contact layer 8 functions to efficiently dissipate heat conducted from the active layer 3 to the outside of the optical semiconductor device 200 through the p-type InP second cladding layer 7 and the p-type InGaAs contact layer 8. In other words, the p-type InP heat dissipation layer 9 plays a role of a heatsink.

This is because the p-type InP heat dissipation layer 9 is positioned higher than the p-type InGaAs contact layer 8 in the lamination direction, the heat dissipation to the outside of the optical semiconductor device 200 can be realized more efficiently than in the optical semiconductor device 500 according to the comparative example in which the p-type InP heat dissipation layer 9 is not provided.

Therefore, in the optical semiconductor device 200 according to Embodiment 1, since heat can be efficiently dissipated by the p-type InP heat dissipation layer 9, it is not necessary to increase the thickness of the p-type InP second cladding layer 7 more than the thickness required for the cladding layer to exhibit its original function, thereby achieving an improvement in heat dissipation and reduction in element resistance at the same time.

As mentioned above, in the optical semiconductor device 200 according to Embodiment 1, since the p-type InP heat dissipation layer 9 is provided on the surface of the p-type InGaAs contact layer 8, the thickness of the p-type InP second cladding layer 7 can be reduced as compared with the optical semiconductor device 500 of the comparative example, which enables reduction in the element resistance, and the p-type InP heat dissipation layer 9 improves the heat dissipation, thereby resulting in superior high-temperature characteristics.

Embodiment 2

Figure 8:
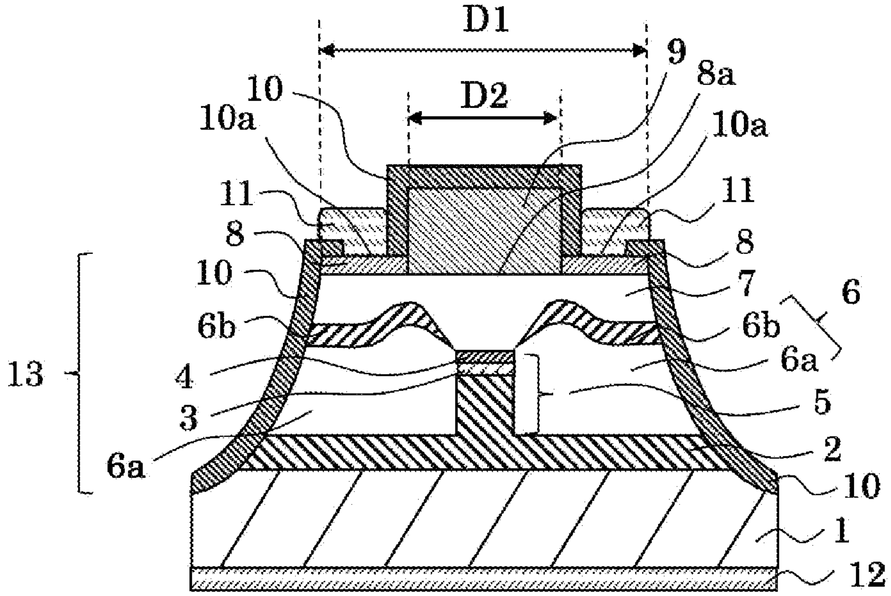
FIG. 8 is a cross-sectional view of a configuration of an optical semiconductor device according to Embodiment 2.

FIG. 8 is a cross sectional view of an optical semiconductor device 210 according to Embodiment 2.

The optical semiconductor device 210 according to Embodiment 2 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer 6*a* and an n-type InP block layer 6*b* which are formed on both side surfaces of the stripe-shaped ridge structure 5, a p-type InP second cladding layer 7 and a p-type InGaAs contact layer 8 which are formed so as to cover a top of the stripe-shaped ridge structure 5 and a surface of the n-type InP block layer 6*b*, a stripe-shaped mesa structure 13 which is centered on the stripe-shaped ridge structure 5 and formed of a mesa reaching from the p-type InGaAs contact layer 8 to the n-type InP substrate 1, both side surfaces of the stripe-shaped mesa structure 13 being formed by the mesa, a mesa protective film 10 made of $SiO_2$ formed so as to cover the both side surfaces of the stripe-shaped mesa structure 13 and a p-type InP heat dissipation layer 9 and both end portions of the surface of the p-type InGaAs contact layer 8, the p-type InP heat dissipation layer 9 which is contact with the p-type InP second cladding layer 7 through a contact layer opening 8*a* provided in the p-type InGaAs contact layer 8, a p-type-side electrode 11 provided on the surface of the p-type InGaAs contact layer 8 at both sides of the p-type InP heat dissipation layer 9, and an n-type-side electrode 12 provided on a rear surface side of the n-type InP substrate 1.

In the optical semiconductor device 210 according to Embodiment 2, the p-type InP heat dissipation layer 9 is in contact with the p-type InP second cladding layer 7 through the contact layer opening 8*a* provided in the p-type InGaAs contact layer 8, which is different from the configuration in which the p-type InP heat dissipation layer 9 is formed on the surface of the p-type InGaAs contact layer 8 in the optical semiconductor device 200 according to Embodiment 1.

The manufacturing method of the optical semiconductor device 210 according to Embodiment 2 will be described below.

The steps of forming the stripe-shaped ridge structure 5 on the n-type InP substrate 1 and burying the buried layer 6 formed of the Fe-doped semi-insulating InP layer 6*a* and the n-type InP block layer 6*b* so as to cover both side surfaces of the stripe-shaped ridge structure 5 by the MOCVD method are the same as those in the method of manufacturing the optical semiconductor device 200 according to Embodiment 1 shown in FIG. 2 to FIG. 4.

After the crystal growth of the buried layer 6, the first $SiO_2$ film 101 is etched away. The p-type InP second cladding layer 7 and the p-type InGaAs contact layer 8 are sequentially laminated by the MOCVD method on the surface of the n type InP block layer 6*b* and the top of the stripe-shaped ridge structure 5 (third crystal growth step).

After the crystal growth of each of the layers mentioned above, a third $SiO_2$ film 104 is deposited on the surface of the p-type InGaAs contact layer 8. The deposition method of the third $SiO_2$ film 104 includes, for example, the CVD method or the like.

Figure 9:
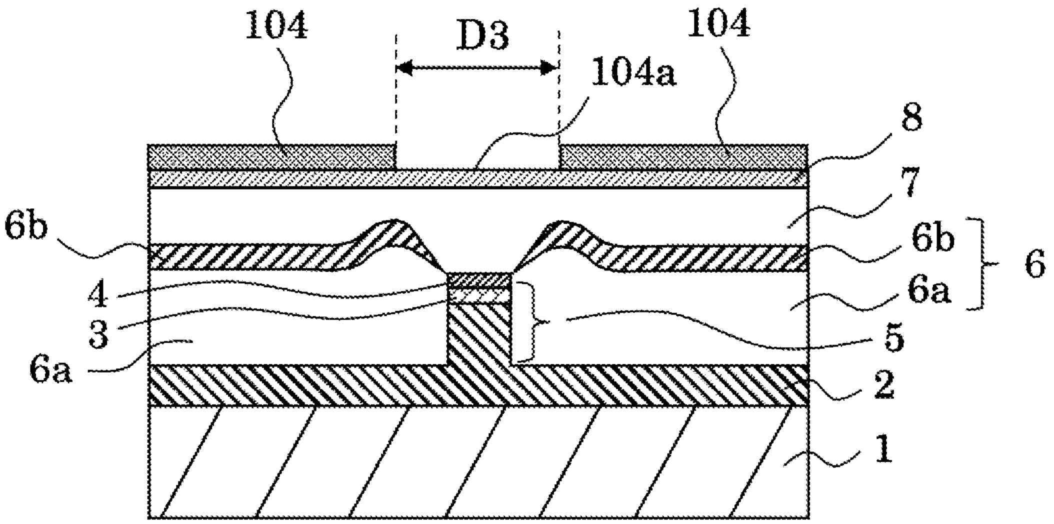
FIG. 9 is a cross-sectional view showing a manufacturing method of the optical semiconductor device according to Embodiment 2.

After the deposition of the third $SiO_2$ film 104, as shown in FIG. 9, the third $SiO_2$ film 104 is patterned into a stripe shape using photolithography and etching techniques so that a stripe-shaped opening of the third $SiO_2$ film 104*a* with a desired etching width D3 is formed.

Figure 10:
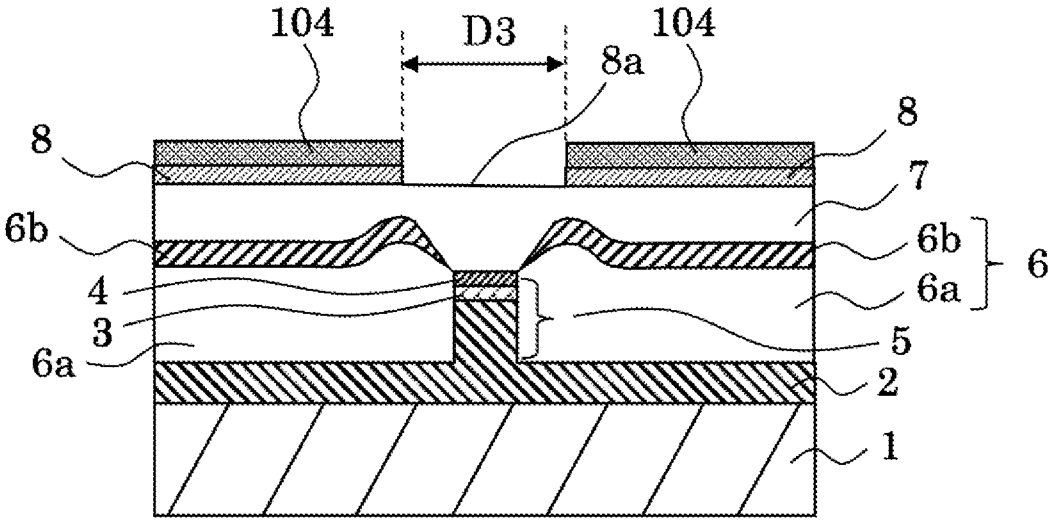
FIG. 10 is a cross-sectional view showing the manufacturing method of the optical semiconductor device according to Embodiment 2.

Subsequently, as shown in FIG. 10, using the stripe-shaped third $SiO_2$ film 104 as an etching mask, the p-type InGaAs contact layer 8 exposed in the stripe-shaped opening of the third $SiO_2$ film 104*a* is etched away by dry etching until the dry etching reaches the surface of the p-type InP second cladding layer 7, thus the contact layer opening 8*a* is formed (contact layer etching step).

In the contact layer etching step, the etching width D3, that is, a width of the contact layer opening 8*a*, is set such that the surface mesa width D1 is larger than the etching width D3 in the optical semiconductor device 210. The etching mask is not limited to a $SiO_2$ film, and may also be a SiN film.

Figure 11:
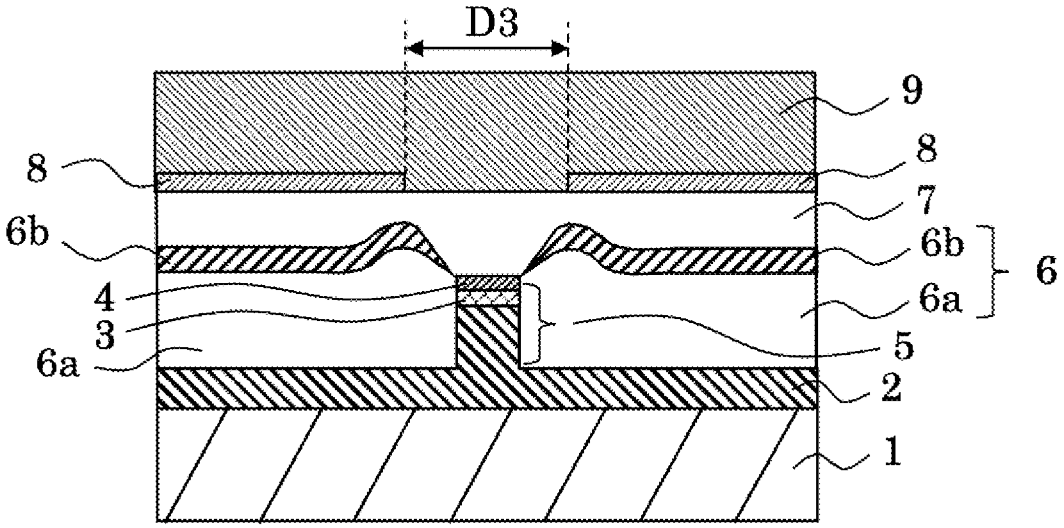
FIG. 11 is a cross-sectional view showing the manufacturing method of the optical semiconductor device according to Embodiment 2.

The third $SiO_2$ film 104 is etched away. As shown in FIG. 11, the p-type InP heat dissipation layer 9 is laminated by the MOCVD method (fourth crystal growth step). Here, it is not necessary that the heat dissipation layer 9 is made of p-type InP, and may also be a material other than InP.

Figure 12:
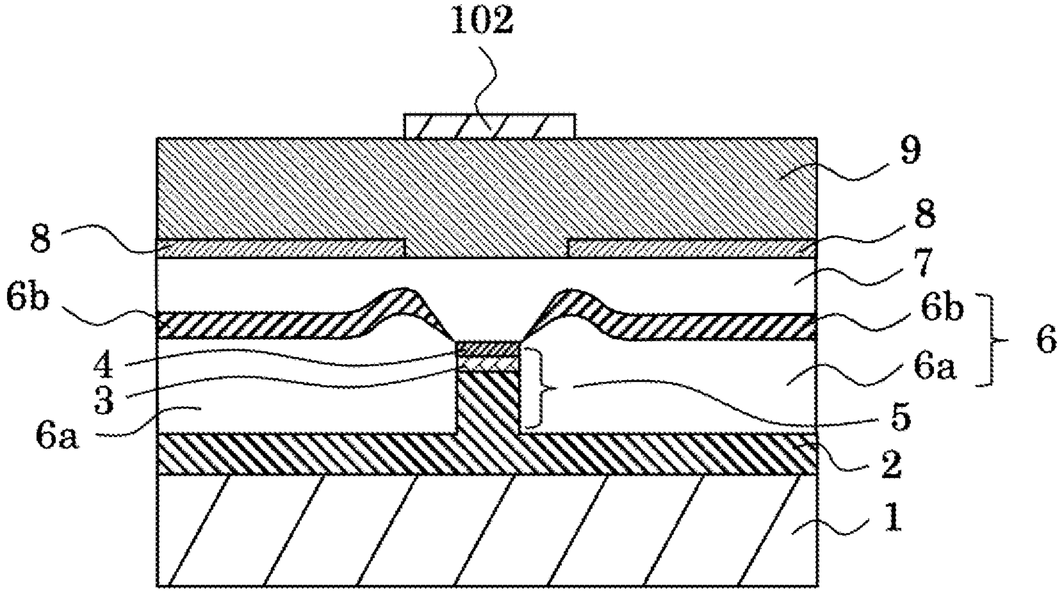
FIG. 12 is a cross-sectional view showing the manufacturing method of the optical semiconductor device according to Embodiment 2.

After the crystal growth of the p-type InP heat dissipation layer 9, a second $SiO_2$ film 102 is deposited on the surface of the p-type InP heat dissipation layer 9. The deposition method of the second $SiO_2$ film 102 includes, for example, the CVD method or the like. As shown in FIG. 12, after the deposition of the second $SiO_2$ film 102, the second $SiO_2$ film 102 is patterned into a stripe shape with a desired width using photolithography and etching techniques.

Figure 13:
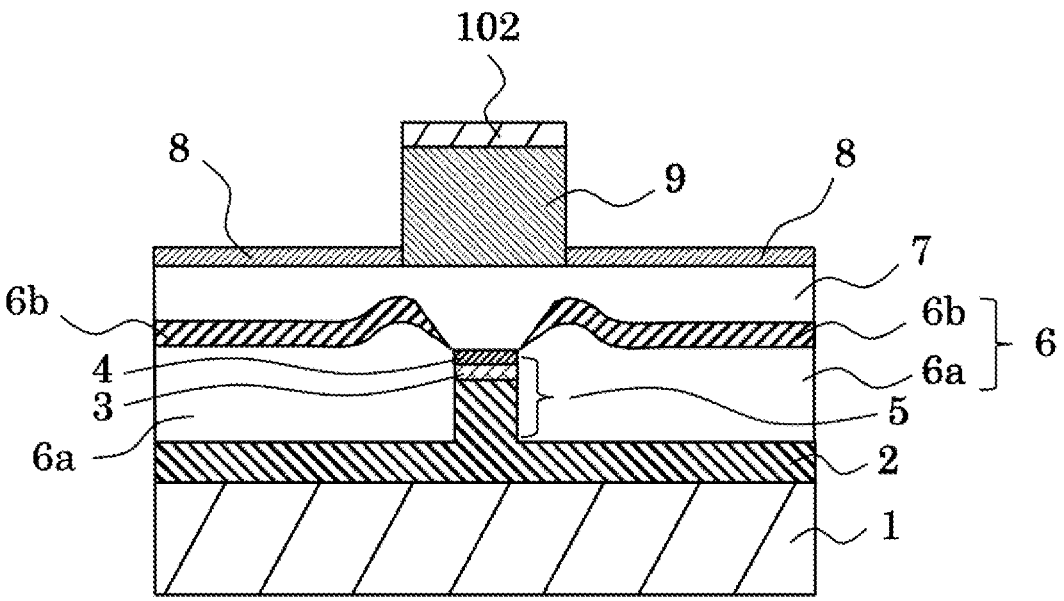
FIG. 13 is a cross-sectional view showing the manufacturing method of the optical semiconductor device according to Embodiment 2.

Subsequently, as shown in FIG. 13, using the stripe-shaped second $SiO_2$ film 102 as an etching mask, dry etching from the p-type InP heat dissipation layer 9 to the surface of the p-type InGaAs contact layer 8 is performed, thus a heat dissipation layer portion composed of the p-type InP heat dissipation layer 9 is formed (heat dissipation layer etching step). The p-type InP heat dissipation layer 9 has a stripe shape such that a bottom of the p-type InP heat dissipation layer 9 is in contact with the p-type InP second cladding layer 7.

As shown in FIG. 8, in the heat dissipation layer etching step, a heat dissipation layer width D2 of the p-type InP heat dissipation layer 9 is set so that the surface mesa width D1 is larger than the heat dissipation layer width D2 in the optical semiconductor device 210. Also, in relation to the etching width D3, the heat dissipation layer width D2 should be set so that the heat dissipation layer width D2 is equal to or larger than the etching width D3. It is preferable that the heat dissipation layer width D2 is equal to the etching width D3 as much as possible. The etching mask is not limited to a $SiO_2$ film, and may also be a SiN film.

The manufacturing method thereafter is the same as the manufacturing method for the optical semiconductor device 200 according to Embodiment 1.

The optical semiconductor device 210 according to Embodiment 2 is manufactured by the above steps.

By applying the manufacturing method mentioned above to a method in manufacturing the optical semiconductor device 210 according to Embodiment 2, the element resistance is reduced and the heat dissipation is improved. As a result, it becomes possible to easily and reproducibly manufacture the optical semiconductor device 210 with excellent high-temperature characteristics.

In the optical semiconductor device 210 according to Embodiment 2, the bottom of the p-type InP heat dissipation layer 9 is in contact with the p-type InP second cladding layer 7, not with the surface of the p-type InGaAs contact layer 8 as in the optical semiconductor device 200 according to Embodiment 1. That means there is no p-type InGaAs contact layer 8 directly above the active layer 3 in the lamination direction, that is, on the top side of the stripe-shaped mesa structure 13. Therefore, absorption of the laser beam by the p-type InGaAs contact layer 8 is significantly reduced.

Since the bandgap energy of the p-type InGaAs contact layer 8 is smaller than that of the active layer 3, the p-type InGaAs contact layer 8 absorbs the laser beam emitted from the active layer 3. Therefore, when the active layer 3 and the p-type InGaAs contact layer 8 are close to each other, the laser beam emitted from the active layer 3 may cause a disturbance in the far-field pattern (FFP) in the lamination direction.

Since the optical semiconductor device 210 according to Embodiment 2 adopts the configuration described above, it has the same effect as the optical semiconductor device 200 according to Embodiment 1. In the optical semiconductor device 210 according to Embodiment 2, furthermore, it becomes possible to suppress the disturbance of FFP in the direction perpendicular to the surface of the n-type InP substrate 1, and to increase the output power.

As mentioned above, the optical semiconductor device 210 according to Embodiment 2 has the same effect of the optical semiconductor device 200 according to Embodiment 1, that is, the effect of improving the heat dissipation and reducing the element resistance. In addition, since the bottom of the p-type InP heat dissipation layer 9 is in contact with the p-type InP second cladding layer 7 and the p-type InGaAs contact layer 8 does not exist directly above the active layer 3 in the lamination direction, the optical semiconductor device 210 according to Embodiment 2 has an effect that the disturbance of FFP can be suppressed and the output power can be increased.

Embodiment 3

Figure 14:
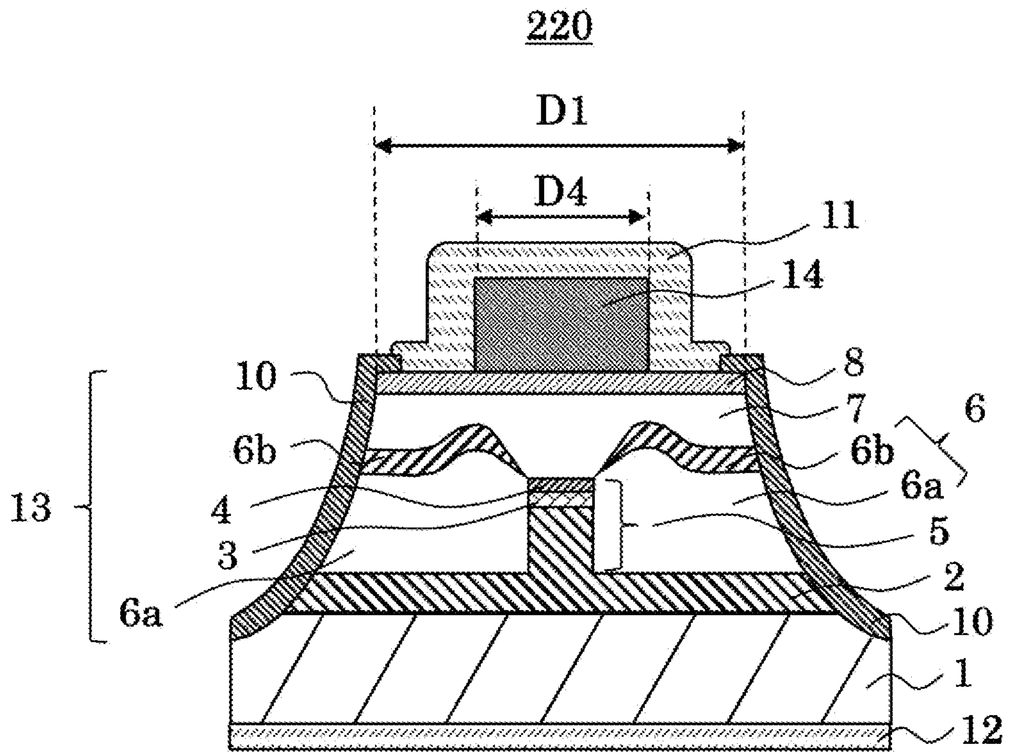
FIG. 14 is a cross-sectional view of a configuration of an optical semiconductor device according to Embodiment 3.

FIG. 14 shows a cross-sectional view of the configuration of the optical semiconductor device 220 according to Embodiment 3.

The optical semiconductor device 220 according to Embodiment 3 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer 6*a* and an n-type InP block layer 6*b* which are formed on both side surfaces of the stripe-shaped ridge structure 5, a p-type InP second cladding layer 7 and a p-type InGaAs contact layer 8 which are formed so as to cover a top of the stripe-shaped ridge structure 5 and a surface of the n-type InP block layer 6*b*, a stripe-shaped mesa structure 13 which is centered on the stripe-shaped ridge structure 5 and formed of a mesa reaching from the p-type InGaAs contact layer 8 to the n-type InP substrate 1, both side surfaces of the stripe-shaped mesa structure 13 being formed by the mesa, a mesa protective film 10 made of $SiO_2$ formed so as to cover the both side surfaces of the stripe-shaped mesa structure 13 and both end portions of the surface of the p-type InGaAs contact layer 8, an undoped InP high-resistance layer 14 which is formed on a surface of the p-type InGaAs contact layer 8, a p-type-side electrode which is formed so as to cover the p-type InGaAs contact layer 8 and the undoped InP high-resistance layer 14, and an n-type-side electrode 12 provided on a rear surface side of the n-type InP substrate 1.

The manufacturing method of the optical semiconductor device 220 according to Embodiment 3 will be described below.

The steps of forming the stripe-shaped ridge structure 5 on the n-type InP substrate 1 and burying the buried layer 6 formed of the Fe-doped semi-insulating InP layer 6*a* and the n-type InP block layer 6*b* by the MOCVD method so as to cover both side surfaces of the stripe-shaped ridge structure 5 are the same as those in the method of manufacturing the optical semiconductor device 200 according to Embodiment 1 shown in FIG. 2 to FIG. 4.

Figure 15:
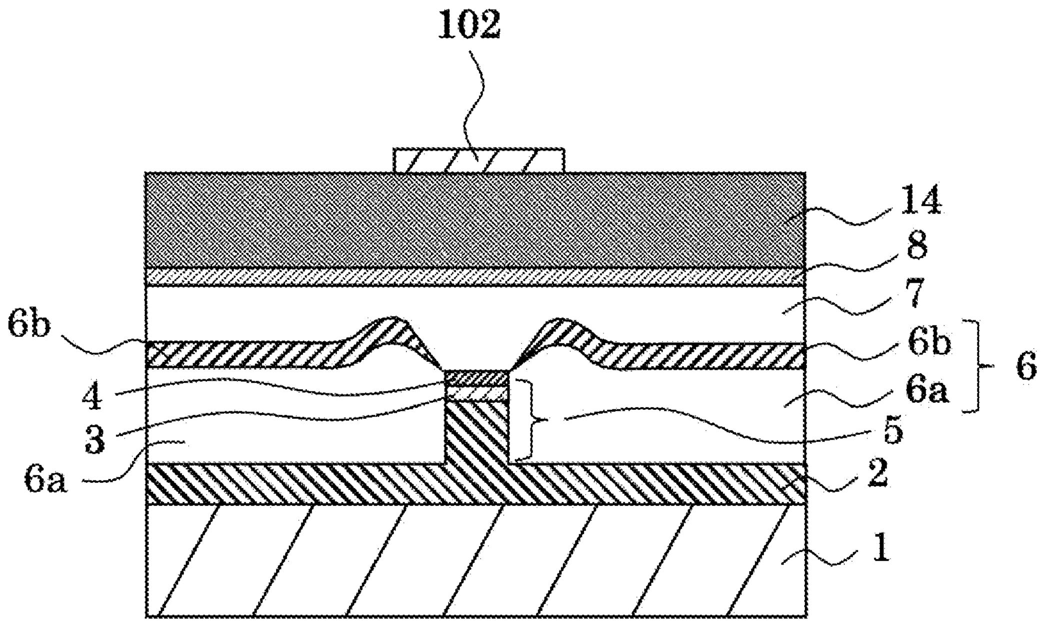
FIG. 15 is a cross-sectional view showing a manufacturing method of the optical semiconductor device according to Embodiment 3.

After the crystal growth of the buried layer 6, the first $SiO_2$ film 101 is etched away. As shown in FIG. 15, the p-type InP second cladding layer 7, the p-type InGaAs contact layer 8 and the undoped InP high-resistance layer 14 are sequentially laminated by the MOCVD method so as to cover the surface of the n-type InP block layer 6*b* and the top of the stripe-shaped ridge structure 5, that is, the surface of the p-type InP first cladding layer 4 (third crystal growth step).

Undoped InP, which is the constituent material of the undoped InP high-resistance layer 14, has a higher resistance than the materials of the n-type InP cladding layer 2, the active layer 3, the p-type InP first cladding layer 4, the p-type InP second cladding layer 7 and the p-type InGaAs contact layer 8, which constitute the optical semiconductor device 220. That is, undoped InP has high-resistivity. Here, a semiconductor layer made of undoped InP is referred to as a high-resistance layer.

The undoped InP high-resistance layer 14 functions to dissipates heat conducted from the active layer 3 to the outside, which is similar to the p-type InP heat dissipation layer 9 that constitutes the optical semiconductor device 200. In other words, a heat dissipation layer is composed of high-resistivity InP material. It is noted that the undoped InP high-resistance layer 14 is not necessarily made of undoped InP, and may be made of an n-type (first-conductivity-type) or semi-insulating material as long as it has high-resistivity, or may be made of a material other than InP as long as it has high-resistivity.

Figure 16:
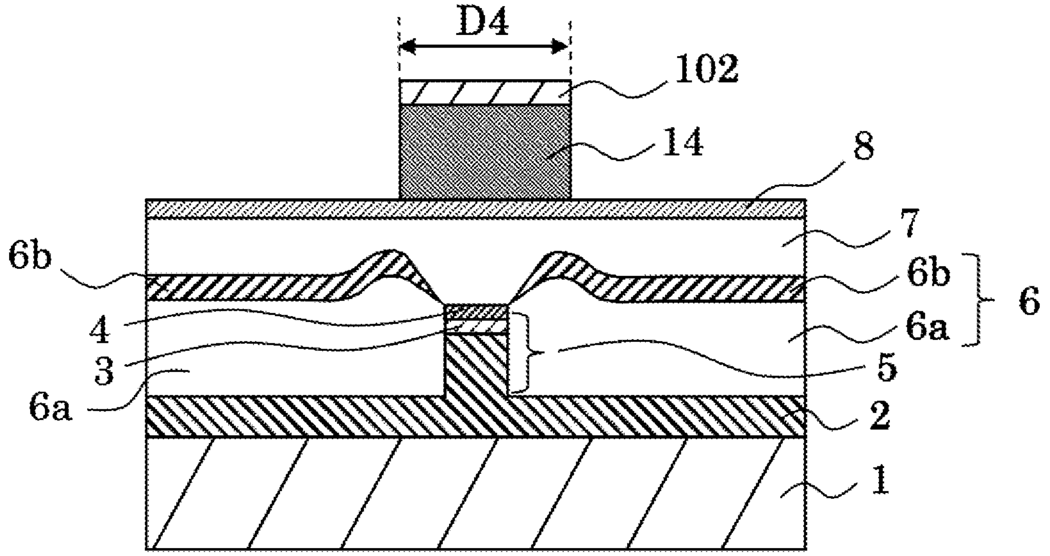
FIG. 16 is a cross-sectional view showing the manufacturing method of the optical semiconductor device according to Embodiment 3.

Next, as shown in FIG. 16, using the second $SiO_2$ film 102 as an etching mask, dry etching from the undoped InP high-resistance layer 14 to the surface of the p-type InGaAs contact layer 8 is performed, thereby forming the heat dissipation layer portion composed of the undoped InP high-resistance layer 14 having a stripe shape (heat dissipation layer etching step).

Figure 17:
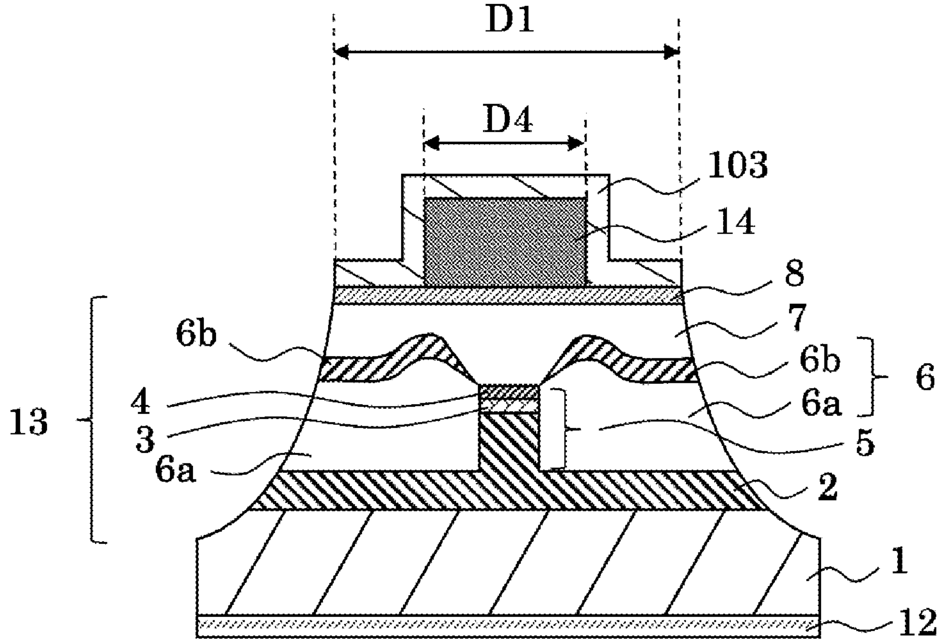
FIG. 17 is a cross-sectional view showing the manufacturing method of the optical semiconductor device according to Embodiment 3.

As shown in FIG. 17, in the heat dissipation layer etching step, a width of the undoped InP high-resistance layer 14, that is, a high-resistance layer width D4 is set so that a surface mesa width D1 is larger than the high-resistance layer width D4 in the optical semiconductor device 220. Note that the etching mask is not limited to a $SiO_2$ film, and may also be a SiN film.

Subsequently, as shown in FIG. 17, wet etching reaching from the p-type InGaAs contact layer 8 to the n-type InP substrate 1 using a resist mask 103 is performed to form a mesa such that the stripe-shaped ridge structure 5 is centered and the surface mesa width D1 is larger than the high-resistance layer width D4 in the optical semiconductor device 220, thereby forming a stripe-shaped mesa structure 13 in which both side surfaces thereof is formed by the mesa and the buried layer 6 is included (mesa structure formation step). Here, the etching mask is not limited to the resist mask, and may also be a SiN film. The etching is not limited to dry etching, and wet etching may also be used.

Note that the stripe-shaped mesa structure 13 may be a mesa structure formed in a stripe shape by performing wet etching from the p-type InGaAs contact layer 8 to the middle of any layer of the Fe-doped semi-insulating InP layer 6*a* and the n-type InP cladding layer 2.

Subsequently, a mesa protective film 10 made of $SiO_2$ is formed on the stripe-shaped mesa structure 13 and the surface and both side surfaces of the undoped InP high-resistance layer 14 (mesa protective film formation step). The deposition method of the mesa protective film 10 made of $SiO_2$ is, for example, a CVD method or the like.

A mesa protective film opening 10*a* is formed in the mesa protective film 10 made of $SiO_2$ formed on both sides of the undoped InP high-resistance layer 14 on the surface of the p-type InGaAs contact layer 8 using photolithography and etching techniques. As a result of the mesa protective film 10 being provided with the mesa protective film opening 10*a*, the mesa protective film 10 is shaped to cover both end portions of the surface of the p-type InGaAs contact layer 8.

After forming the stripe-shaped mesa structure 13, the p-type-side electrode 11 is formed so as to cover the surface of the p-type InGaAs contact layer 8 and the surface of the undoped InP high-resistance layer 14 (electrode formation step). The n-type-side electrode 12 is formed on a rear surface side of the n-type InP substrate 1.

By each of the above steps, the optical semiconductor device 220 according to Embodiment 3 is manufactured.

By applying the manufacturing method mentioned above to a method in manufacturing the optical semiconductor device 220 according to Embodiment 3, the element resistance is reduced and the heat dissipation is improved. As a result, it becomes possible to easily and reproducibly manufacture the optical semiconductor device 220 with excellent high-temperature characteristics.

Next, the function of the undoped InP high-resistance layer 14, which is a characteristic configuration in the optical semiconductor device 220 according to Embodiment 3, will be described below.

The undoped InP high-resistance layer 14 functions to efficiently dissipate heat conducted from the active layer 3 through the p-type InP second cladding layer 7 and the p-type InGaAs contact layer 8 to the outside of the optical semiconductor device 220. That is, the undoped InP high-resistance layer 14 serves as a heatsink.

This is because, since the undoped InP high-resistance layer 14 is positioned higher than the p-type InGaAs contact layer 8 in the lamination direction, the heat dissipation to the outside of the optical semiconductor device 220 can be realized more efficiently than in the optical semiconductor device 500 according to the comparative example in which the undoped InP high-resistance layer 14 is not provided.

That is, in the optical semiconductor device 220 according to Embodiment 3, since heat can be efficiently dissipated by the undoped InP high-resistance layer 14, it is not necessary to increase the thickness of the p-type InP second cladding layer 7 beyond the thickness at which the p-type InP second cladding layer 7 can exhibit the original function of the cladding layer, thereby achieving an improvement in heat dissipation and reduction in element resistance.

As shown in FIG. 14, in the optical semiconductor device 220 according to Embodiment 3, the p-type-side electrode 11 is provided so as to cover not only the p-type InGaAs contact layer 8 but also the whole surface of the undoped InP high-resistance layer 14 including the side surfaces thereof. Since the p-type-side electrode 11 has higher thermal conductivity than the semiconductor layers, the p-type-side electrode 11 provided on the surface of the undoped InP high-resistance layer 14 also contributes to heat dissipation from the undoped InP high-resistance layer 14. Therefore, heat dissipation performance of the optical semiconductor device 220 is further improved.

As mentioned above, in the optical semiconductor device 220 according to Embodiment 3, since the undoped InP high-resistance layer 14 is provided on the surface of the p-type InGaAs contact layer 8, the thickness of the p-type InP second cladding layer 7 can be reduced as compared with the optical semiconductor device 500 according to the comparative example, and thus the element resistance can be reduced. In addition, since the undoped InP high-resistance layer 14 improves heat dissipation, high-temperature characteristics are also improved.

Further, since the p-type-side electrode 11 is provided on the whole surface of the undoped InP high-resistance layer 14, it becomes possible to further improve heat dissipation, thereby further improving high-temperature characteristics.

Embodiment 4

Figure 18:
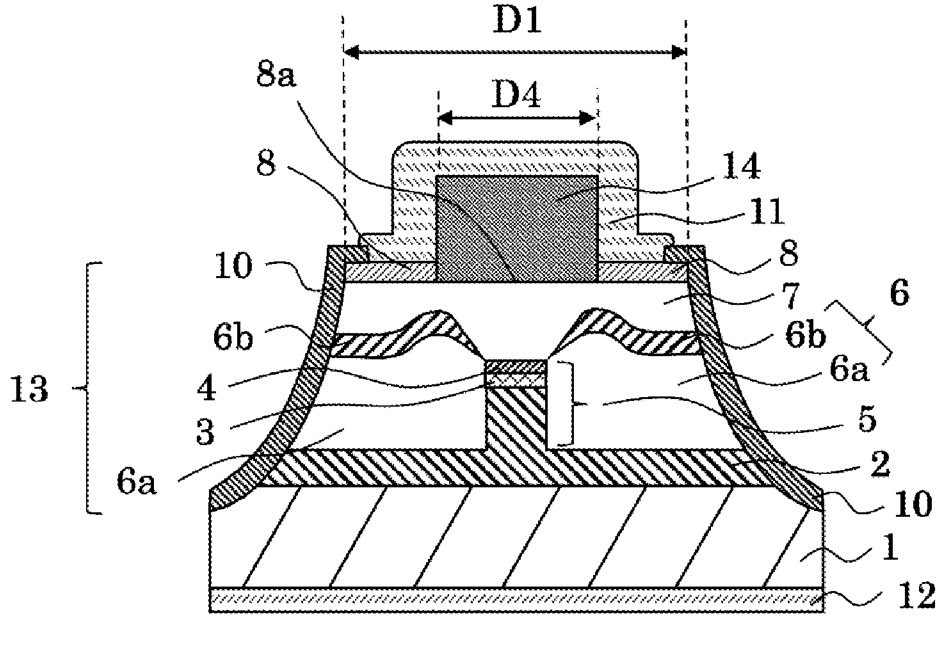
FIG. 18 is a cross-sectional view of a configuration of an optical semiconductor device according to Embodiment 4.

FIG. 18 is a cross-sectional view of the configuration of the optical semiconductor device 230 according to Embodiment 4.

The optical semiconductor device 230 according to Embodiment 4 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer **6*a* and an n-type InP block layer 6*b* which are formed on both side surfaces of the stripe-shaped ridge structure 5, a p-type InP second cladding layer 7 and a p-type InGaAs contact layer 8 which are formed so as to cover a top of the stripe-shaped ridge structure 5 and a surface of the n-type InP block layer 6*b*, a stripe-shaped mesa structure 13 which is centered on the stripe-shaped ridge structure 5 and formed of a mesa reaching from the p-type InGaAs contact layer 8 to the n-type InP substrate 1, both side surfaces of the stripe-shaped mesa structure 13 being formed by the mesa, a mesa protective film 10 made of $SiO_2$ formed so as to cover the both side surfaces of the stripe-shaped mesa structure 13 and both end portions of the surface of the p-type InGaAs contact layer 8, an undoped InP high-resistance layer 14 which is contact with the p-type InP second cladding layer 7 through a contact layer opening 8*a* provided in the p-type InGaAs contact layer 8, a p-type-side electrode 11 which is formed so as to cover the p-type InGaAs contact layer 8 and the undoped InP high-resistance layer 14, and an n-type-side electrode 12 provided on a rear surface side of the n-type InP substrate 1**.

The manufacturing method of the optical semiconductor device 230 according to Embodiment 4 will be described below.

The steps of forming the stripe-shaped ridge structure 5 on the n-type InP substrate 1 and burying the buried layer 6 formed of the Fe-doped semi-insulating InP layer **6*a* and the n-type InP block layer 6*b* so as to cover both side surfaces of the stripe-shaped ridge structure 5 by the MOCVD method are the same as those in the method of manufacturing the optical semiconductor device 200 according to Embodiment 1 shown in FIG. 2 to FIG. 4**.

After the buried layer 6 is grown, the p-type InP second cladding layer 7 and the p-type InGaAs contact layer 8 are sequentially formed by the MOCVD method (third crystal growth step), and the p-type InGaAs contact layer 8 is etched away by dry etching using the stripe-shaped third $SiO_2$ film 104 as the etching mask (contact layer etching step) in the same manner as in the method of manufacturing the optical semiconductor device 210 according to Embodiment 2, as shown in FIG. 9 and FIG. 10.

Figure 19:
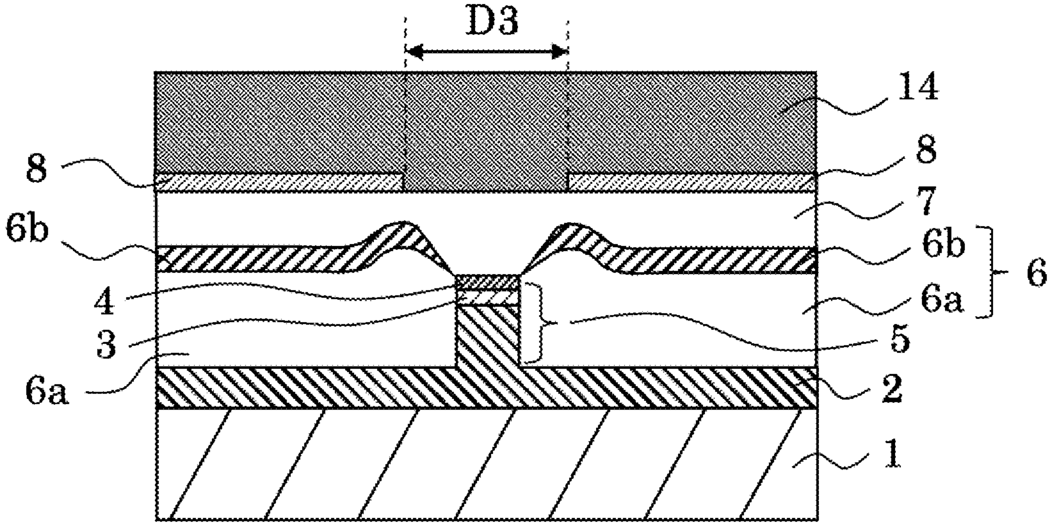
FIG. 19 is a cross-sectional view showing a manufacturing method of the optical semiconductor device according to Embodiment 4.

As shown in FIG. 19, after removing the stripe-shaped third $SiO_2$ film 104, the undoped InP high-resistance layer 14 is laminated by the MOCVD method (fourth crystal growth step). Here, the high-resistance layer 14 is not necessarily made of undoped InP, but may be made of an n-type or semi-insulating material, or a material other than InP.

Figure 20:
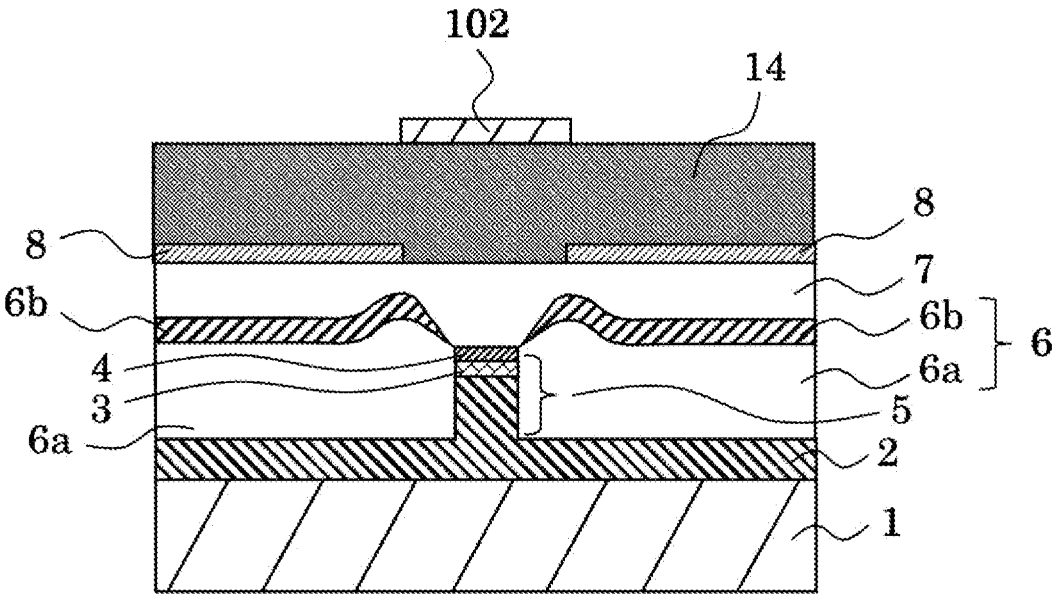
FIG. 20 is a cross-sectional view showing the manufacturing method of the optical semiconductor device according to Embodiment 4.

After the crystal growth of the undoped InP high-resistance layer 14, a second $SiO_2$ film 102 is deposited on the surface of the undoped InP high-resistance layer 14. The deposition method of the second $SiO_2$ film 102 includes, for example, the CVD method or the like. As shown in FIG. 20, after the deposition of the second $SiO_2$ film 102, using photolithography and etching techniques, the second $SiO_2$ film 102 is patterned into a stripe shape with a desired width.

Figure 21:
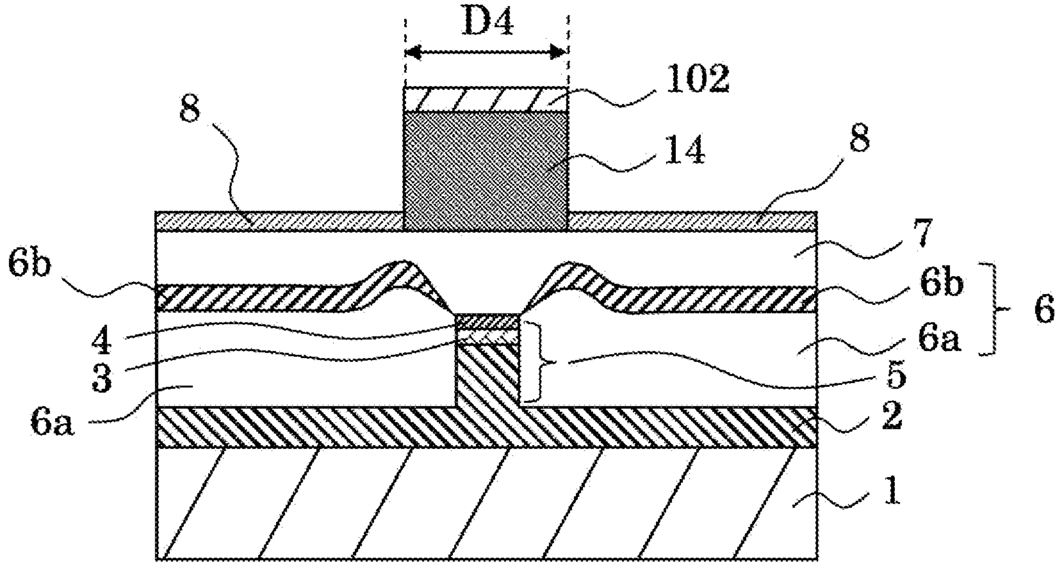
FIG. 21 is a cross-sectional view showing the manufacturing method of the optical semiconductor device according to Embodiment 4.

Next, as shown in FIG. 21, using the second $SiO_2$ film 102 as an etching mask, dry etching from the undoped InP high-resistance layer 14 to the surface of the p-type InGaAs contact layer 8 is performed, thereby forming the high-resistance layer portion composed of the undoped InP high-resistance layer 14 having a stripe shape (heat dissipation layer etching step).

As shown in FIG. 18, in the heat dissipation layer etching step, a width of the undoped InP high-resistance layer 14, that is, a high-resistance layer width D4 is set so that a surface mesa width D1 is larger than the high-resistance layer width D4 in the optical semiconductor device 230. Also, in relation to the etching width D3, the high-resistance layer width D4 should be set so that the high-resistance layer width D4 is equal to or larger than the etching width D3. It is preferable that the high-resistance layer width D4 is equal to the etching width D3 as much as possible. The etching mask is not limited to a $SiO_2$ film, and may also be a SiN film.

The manufacturing method thereafter is the same as the manufacturing method for the optical semiconductor device 220 according to Embodiment 3.

The optical semiconductor device 230 according to Embodiment 4 is manufactured by the above steps.

By applying the manufacturing method mentioned above to a method in manufacturing the optical semiconductor device 230 according to Embodiment 4, the element resistance is reduced and the heat dissipation is improved. As a result, it becomes possible to easily and reproducibly manufacture the optical semiconductor device 230 with excellent high-temperature characteristics.

The optical semiconductor device 230 according to Embodiment 4 has the same effect as that of the optical semiconductor device 220 according to Embodiment 3. Further, since the bottom of the undoped InP high-resistance layer 14 is in contact with the p-type InP second cladding layer 7, not with the surface of the p-type InGaAs contact layer 8 as in the optical semiconductor device 220 according to Embodiment 3, there is no p-type InGaAs contact layer 8 directly above the active layer 3 in the lamination direction, that is, on the top side of the stripe-shaped mesa structure 13. Therefore, the absorption of the laser beam by the p-type InGaAs contact layer 8 is significantly reduced.

Therefore, in the optical semiconductor device 230 according to Embodiment 4, the disturbance of the FFP in the direction perpendicular to the surface of the n-type InP substrate 1 can be suppressed, and the output power can be increased.

As mentioned above, the optical semiconductor device 230 according to Embodiment 4 achieves the same effects of the optical semiconductor device 220 according to Embodiment 3, that is, the effects of improvement in heat dissipation and reduction in element resistance. In addition, since the bottom of the undoped InP high-resistance layer 14 is in contact with the p-type InP second cladding layer 7 and the p-type InGaAs contact layer 8 is not provided directly above the active layer 3 in the lamination direction, it becomes further possible to suppress the disturbance of the FFP and to increase the output power.

Embodiment 5

Figure 22:
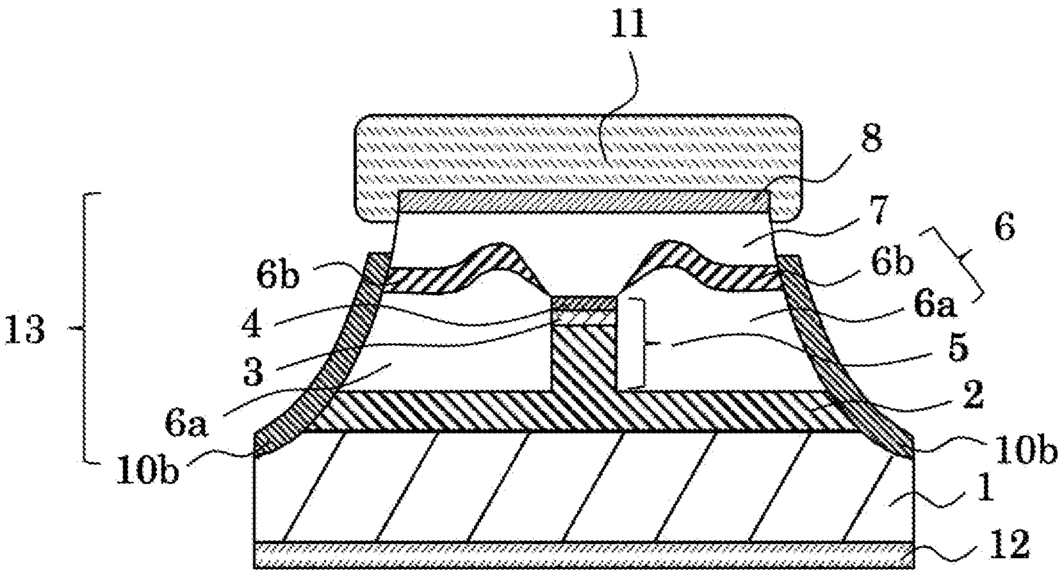
FIG. 22 is a cross-sectional view of a configuration of an optical semiconductor device according to Embodiment 5.

FIG. 22 shows a cross-sectional view of the optical semiconductor device 240 according to Embodiment 5. The optical semiconductor device 240 according to Embodiment 5 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer 6*a* and an n-type InP block layer 6*b* which are formed on both side surfaces of the stripe-shaped ridge structure 5, a p-type InP second cladding layer 7 and a p-type InGaAs contact layer 8 which are formed so as to cover a top of the stripe-shaped ridge structure 5 and a surface of the n-type InP block layer 6*b*, a stripe-shaped mesa structure 13 formed of a mesa reaching from the p-type InGaAs contact layer 8 to the n-type InP substrate 1, both side surfaces of the stripe-shaped mesa structure 13 being formed by the mesa, a partial mesa protective film which is made of a $SiO_2$ film and provided on both side surfaces of the stripe-shaped mesa structure 13, one end portion thereof reaching the n-type InP substrate 1 exposed on the both side surfaces, the other end portion thereof covering the buried layer 6 exposed on the both side surfaces, a p-type-side electrode 11 which is formed on the surface of the p-type InGaAs contact layer 8 and covers the both side surfaces of the p-type InGaAs contact layer 8 and a part of the both side surfaces of the p-type second cladding layer 7 which are exposed on the both side surfaces of the stripe-shaped mesa structure 13, and an n-type-side electrode 12 provided on a rear surface side of the n-type InP substrate 1.

The manufacturing method of the optical semiconductor device 240 according to Embodiment 5 will be described below.

The manufacturing method is the same as that of the optical semiconductor device 210 according to Embodiment 2 up to the steps of forming the stripe-shaped ridge structure 5 on the n-type InP substrate 1, burying the buried layer 6 formed of the Fe-doped semi-insulating InP layer 6*a* and the n-type InP block layer 6*b* by the MOCVD method so as to cover both side surfaces of the stripe-shaped ridge structure 5, and sequentially laminating the p-type InP second cladding layer 7 and the p-type InGaAs contact layer 8 by the MOCVD method.

Figure 23:
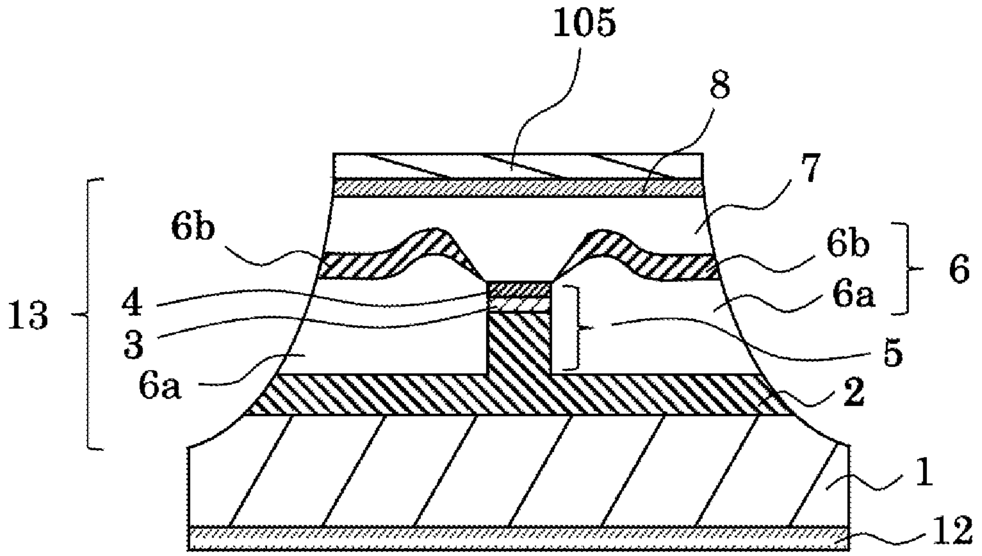
FIG. 23 is a cross-sectional view showing a manufacturing method of the optical semiconductor device according to Embodiment 5.

Subsequently, as shown in FIG. 23, both side surfaces of the stripe-shaped ridge structure 5 are formed by the mesa, centered on the stripe-shaped ridge structure 5, which are formed by wet etching from the p-type InGaAs contact layer 8 to the n-type InP substrate 1 using a resist mask 105. As a result, a stripe-shaped mesa structure 13 including the buried layer 6 is formed (mesa structure formation step). Here, the etching mask is not limited to the resist, and may also be a $SiO_2$ film or a SiN film.

Note that the stripe-shaped mesa structure 13 may also be a stripe-shaped mesa structure which is formed by wet etching from the p-type InGaAs contact layer 8 to the middle of any layer of the Fe-doped semi-insulating InP layer 6*a* and the n-type InP cladding layer 2.

Figure 24:
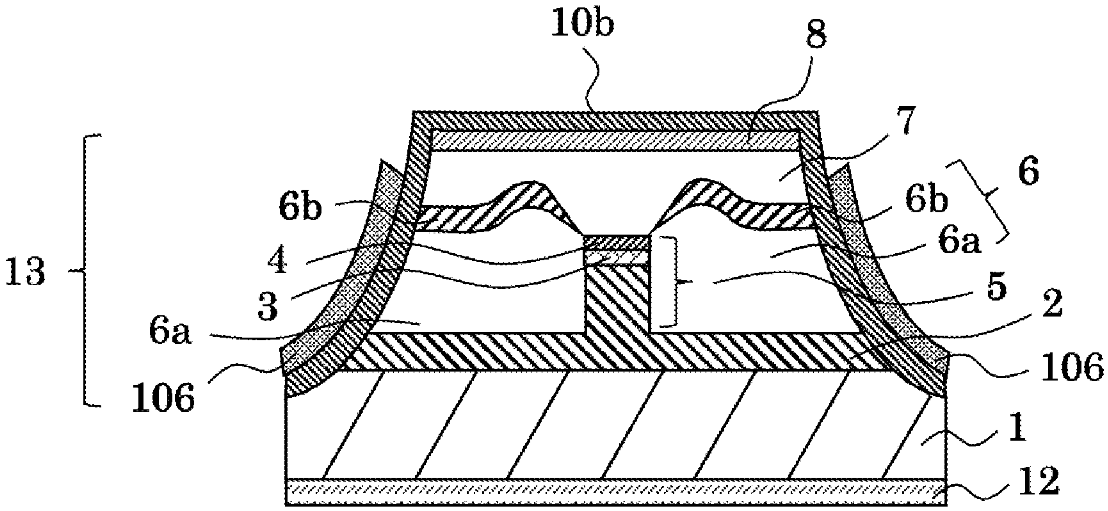
FIG. 24 is a cross-sectional view showing the manufacturing method of the optical semiconductor device according to Embodiment 5.

Next, as shown in FIG. 24, a partial mesa protective film 10*b* which is made of $SiO_2$ is deposited on a whole surface including both side surfaces of the stripe-shaped mesa structure 13. A resist mask is formed in order to open the p-type InGaAs contact layer 8 and partially the p-type InP second cladding layer 7. Using the resist mask as an etching mask, the partial mesa protective film 10*b* which is made of $SiO_2$ is etched (partial mesa protective film formation step). The partial mesa protective film 10*b* made of $SiO_2$ needs to cover the n-type InP block layer 6*b* exposed on both side surfaces of the stripe-shaped mesa structure 13.

After processing the partial mesa protective film 10*b* made of $SiO_2$, a p-type-side electrode 11 is formed on the surface of the InGaAs contact layer 8, and an n-type-side electrode 12 is formed on a rear surface side of the n-type InP substrate 1.

In the formation of the p-type-side electrode 11 above mentioned, both end portions of the p-type-side electrode 11 may cover the p-type InGaAs contact layer 8 and at least a part of the p-type InP second cladding layer 7, which are exposed on both side surfaces of the stripe-shaped mesa structure 13. Moreover, the both end portions of the p-type-side electrode 11 may cover the p-type InGaAs contact layer 8 and the p-type InP second cladding layer 7, which are exposed on both side surfaces of the stripe-shaped mesa structure 13, and at least a part of the partial mesa protective film 10*b* made of $SiO_2$.

By each of the above steps, the optical semiconductor device 240 according to Embodiment 5 is manufactured.

By applying the manufacturing method mentioned above to a method in manufacturing the optical semiconductor device 240 according to Embodiment 5, the element resistance is reduced and the heat dissipation is improved. As a result, it becomes possible to easily and reproducibly manufacture the optical semiconductor device 240 with excellent high-temperature characteristics.

In the optical semiconductor device 500 according to the comparative example, the p-type-side electrode 11 is in contact with the p-type InGaAs contact layer 8 only at the top of the stripe-shaped mesa structure 13.

On the other hand, in the optical semiconductor device 240 according to Embodiment 5, since the opening of the side $SiO_2$ partial mesa protective film 10*b* is widened to the p-type InP second cladding layer 7 exposed on both side surfaces of the stripe-shaped mesa structure 13, both end portions of the p-type-side electrode 11 are in contact with the whole p-type InGaAs contact layer 8 including the portions exposed on the both side surfaces and a part of the p-type InP second cladding layer 7 exposed on the both side surfaces, so that heat dissipation performance of the optical semiconductor device 240 is further improved.

As mentioned above, in the optical semiconductor device 240 according to Embodiment 5, since the contact area between the p-type-side electrode 11 and each semiconductor layer is increased as compared with the optical semiconductor device 500 according to the comparative example, the contact resistance between the p-type-side electrode 11 and each semiconductor layer is reduced. Therefore, the element resistance of the optical semiconductor device 240 is reduced. In addition, due to the improvement in heat dissipation, high-temperature characteristics of the optical semiconductor device 240 are improved.

Embodiment 6

Figure 25:
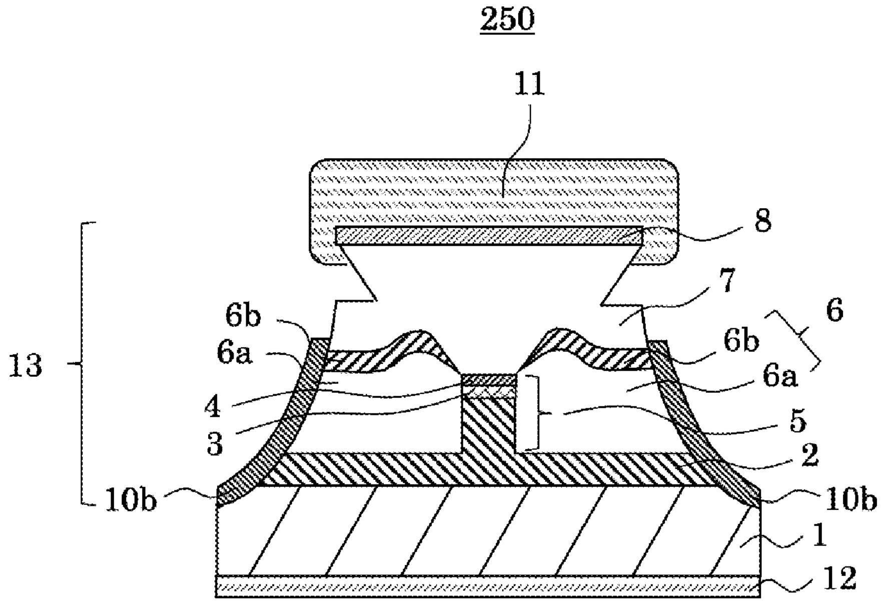
FIG. 25 is a cross-sectional view of a configuration of an optical semiconductor device according to Embodiment 6.

FIG. 25 shows a cross-sectional view of an optical semiconductor device 250 according to Embodiment 6.

The optical semiconductor device 250 according to Embodiment 5 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer 6*a* and an n-type InP block layer 6*b* which are formed on both side surfaces of the stripe-shaped ridge structure 5, a p-type InP second cladding layer 7 which is formed so as to cover a top of the strip-shaped ridge structure 5 and a surface of the n-type InP block layer 6*b* and having an upper end portion thereof in an inverted mesa shape, that is, a shape such that a width thereof widens in a lamination direction, a the p-type InGaAs contact layer 8 which is formed on a top of the p-type InP second cladding layer 7, a stripe-shaped mesa structure 13 formed of a mesa reaching from the p-type InGaAs contact layer 8 to the n-type InP substrate 1, a partial mesa protective film 10*b* which is made of a $SiO_2$ film and provided on both side surfaces of the stripe-shaped mesa structure 13, one end portion thereof reaching the n-type InP substrate 1 exposed on the both side surfaces, the other end portion thereof covering the buried layer 6 exposed on the both side surfaces, a p-type-side electrode 11 which is formed on the surface of the p-type InGaAs contact layer 8 and covers the both side surfaces of the p-type InGaAs contact layer 8 and a part of the both side surfaces of the p-type second cladding layer 7, and an n-type-side electrode 12 provided on a rear surface side of the n-type InP substrate 1.

The manufacturing method of the optical semiconductor device 250 according to Embodiment 6 will be described below.

The steps of forming the stripe-shaped ridge structure 5 on the n-type InP substrate 1, burying the buried layer 6 formed of the Fe-doped semi-insulating InP layer 6*a* and the n-type InP block layer 6*b* by the MOCVD method so as to cover both side surfaces of the stripe-shaped ridge structure 5, sequentially laminating the p-type InP second cladding layer 7 and the p-type InGaAs contact layer 8 by the MOCVD method, and forming the stripe-shaped mesa structure 13 are the same as those of the method of manufacturing the optical semiconductor device 240 according to Embodiment 5.

After forming the stripe-shaped mesa structure 13, wet etching is performed again without removing the resist mask 105. As an etchant, for example, a mixed solution of hydrogen bromide, nitric acid, and hydrogen peroxide is used. By this wet etching, etching in the inverted mesa direction proceeds from an upper end portion of the p-type InP second cladding layer 7. At this time, the etching is performed so as not to reach the n-type InP cladding layer 2. Noted that the upper end portion of the p-type InP second cladding layer 7 means the upper surface side in contact with the p-type InGaAs contact layer 8 of the upper and lower surfaces in the layer thickness direction of the p-type InP second cladding layer 7.

That is, at least a part of the upper end portion of the p-type InP second cladding layer 7 is etched so as to have a shape in which the width increases in the laminating direction in a cross section perpendicular to the stripe direction.

Note that as the etchant, a chemical solution other than the above may be used as long as etching in the inverted mesa direction can be performed.

The manufacturing method thereafter is the same as the manufacturing method for the optical semiconductor device 240 according to Embodiment 5.

The optical semiconductor device 250 according to Embodiment 6 is manufactured by the above steps.

By applying the manufacturing method mentioned above to a method in manufacturing the optical semiconductor device 250 according to Embodiment 6, the element resistance is reduced and the heat dissipation is improved. As a result, it becomes possible to easily and reproducibly manufacture the optical semiconductor device 250 with excellent high-temperature characteristics.

In the optical semiconductor device 250 according to Embodiment 6, when heat generated in the active layer 3 is conducted to the p-type InGaAs contact layer 8 through the p-type InP second cladding layer 7, heat conduction occurs not only from the surface of the p-type InGaAs contact layer 8 to the p-type-side electrode 11 but also from both side surfaces of the p-type InGaAs contact layer 8, and portions of both side surfaces of the p-type InP second cladding layer 7 that are in contact with the p-type-side electrode 11. In addition, since the upper end portion of the p-type InP second cladding layer 7 has an inverted mesa shape, the contact area between both side surfaces of the p-type InP second cladding layer 7 and the p-type-side electrode 11 can be structurally ensured to be larger than that in the optical semiconductor device 240 according to Embodiment 5, so that heat dissipation performance is further improved.

As mentioned above, in the optical semiconductor device 250 according to Embodiment 6, the p-type InP second cladding layer 7 having the inverted mesa shape at the upper end, that is, a shape in which the width increases in the lamination direction is provided, and at least a part of both side surfaces of the p-type InP second cladding layer 7 is covered with the p-type-side electrode 11, so that heat conduction from both side surfaces of the p-type InGaAs contact layer 8 and both side surfaces of the p-type InP second cladding layer 7 in contact with the p-type-side electrode 11 becomes possible in addition to heat conduction from the surface of the p-type InGaAs contact layer 8 to the p-type-side electrode 11, thereby further improving heat dissipation performance of the optical semiconductor device 250. As a result, high-temperature characteristics of the optical semiconductor device 250 are improved.

Embodiment 7

Figure 26:
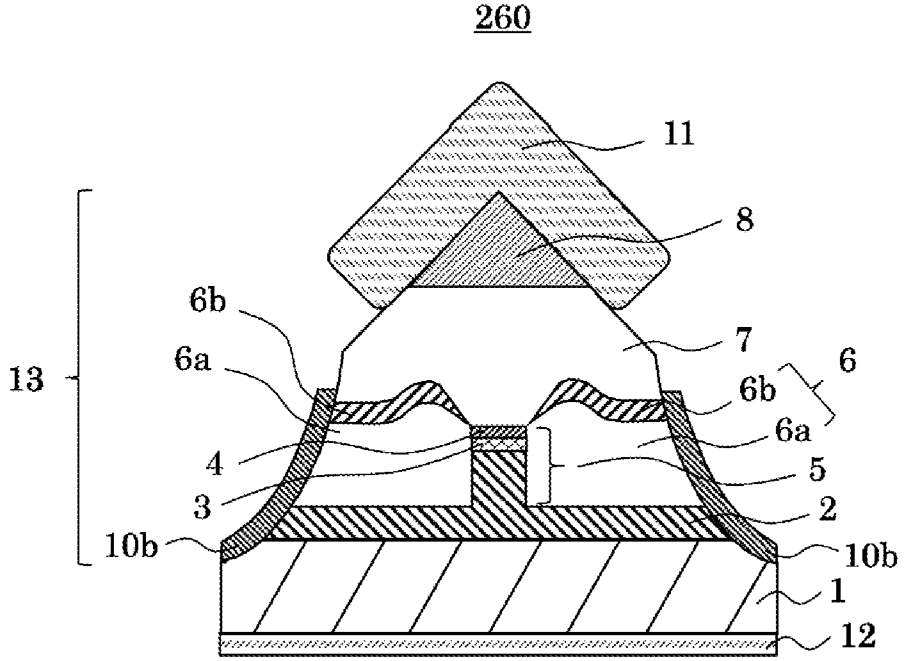
FIG. 26 is a cross-sectional view of a configuration of an optical semiconductor device according to Embodiment 7.

FIG. 26 shows a cross-sectional view of the optical semiconductor device 260 according to Embodiment 7.

The optical semiconductor device 260 according to Embodiment 7 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer 6*a* and an n-type InP block layer 6*b* which are formed on both side surfaces of the stripe-shaped ridge structure 5, a p-type InP second cladding layer 7 which is formed so as to cover a top of the strip-shaped ridge structure 5 and a surface of the n-type InP block layer 6*b* and having an upper end portion thereof in a forward mesa shape, that is, a shape such that a width thereof narrows in a lamination direction, a p-type InGaAs contact layer 8 which is formed on a top of the p-type InP second cladding layer 7 and having a forward mesa shape like the p-type InP second cladding layer 7, a stripe-shaped mesa structure 13 formed of a mesa reaching from the p-type InGaAs contact layer 8 to the n-type InP substrate 1, a partial mesa protective film 10*b* which is made of a $SiO_2$ film and provided on both side surfaces of the stripe-shaped mesa structure 13, one end portion thereof reaching the n-type InP substrate 1 exposed on the both side surfaces, the other end portion thereof covering the buried layer 6 exposed on the both side surfaces, a p-type-side electrode 11 which is formed so as to cover a surface of the p-type InGaAs contact layer 8 and a part of the p-type InP second cladding layer 7 and having a shape such that a width thereof narrows in the lamination direction, and an n-type-side electrode 12 provided on a rear surface side of the n-type InP substrate 1.

The manufacturing method of the optical semiconductor device 260 according to Embodiment 7 will be described below.

The steps of forming the stripe-shaped ridge structure 5 on the n-type InP substrate 1, burying the buried layer 6 formed of the Fe-doped semi-insulating InP layer 6*a* and the n-type InP block layer 6*b* by the MOCVD method so as to cover both side surfaces of the stripe-shaped ridge structure 5, sequentially laminating the p-type InP second cladding layer 7 and the p-type InGaAs contact layer 8 by the MOCVD method, and forming the stripe-shaped mesa structure 13 are the same as those of the method of manufacturing the optical semiconductor device 240 according to Embodiment 5.

After forming the stripe-shaped mesa structure 13, wet etching is performed again without removing the resist mask 105. As an etchant, for example, a mixed solution of hydrochloric acid, hydrogen peroxide, and acetic acid is used. With the wet etching, the etching proceeds in the forward mesa direction from the p-type InGaAs contact layer 8. At this time, the etching is performed so as not to reach the n-type InP cladding layer 2.

That is, at least a part of the upper end portion of the p-type InP second cladding layer 7 is etched into a shape in which the width is narrowed in the lamination direction in a cross section perpendicular to a stripe direction.

Note that the etchant may be a chemical solution other than the above as long as etching in the forward mesa direction can be performed. An etching surface is not limited to the forward mesa shape, as long as etching having a gradient different from that of the stripe-shaped mesa structure 13 is realized, and a chemical solution capable of realizing such a shape may be used.

The manufacturing method thereafter is the same as the manufacturing method for the optical semiconductor device 240 according to Embodiment 5.

The optical semiconductor device 260 according to Embodiment 7 is manufactured by the above steps.

By applying the manufacturing method mentioned above to a method in manufacturing the optical semiconductor device 260 according to Embodiment 7, the element resistance is reduced and the heat dissipation is improved. As a result, it becomes possible to easily and reproducibly manufacture the optical semiconductor device 260 with excellent high-temperature characteristics.

In the optical semiconductor device 260 according to Embodiment 7, when heat generated in the active layer 3 is conducted to the p-type InGaAs contact layer 8 through the p-type InP second cladding layer 7, heat conduction occurs not only from the surface of the p-type InGaAs contact layer 8 to the lower portion of the p-type-side electrode 11 but also from both side surfaces of the p-type InGaAs contact layer 8 and portions of both side surfaces of the p-type InP second cladding layer 7 which are in contact with the p-type-side electrode 11. In addition, since the upper end portion of the p-type InP second cladding layer 7 and the p-type InGaAs contact layer 8 have the forward mesa shape, the contact area between both side surfaces of the p-type InP second cladding layer 7 and the p-type-side electrode 11 can be structurally ensured to be larger than that in the optical semiconductor device 240 according to Embodiment 5, so that heat dissipation performance is further improved.

As mentioned above, in the optical semiconductor device 260 according to Embodiment 7, the p-type InP second cladding layer 7 and the p-type InGaAs contact layer 8 having the forward mesa shape at the upper end, that is, the shape in which the width narrows in the lamination direction is provided, and both side surfaces of the p-type InGaAs contact layer 8 and at least a part of both side surfaces of the p-type InP second cladding layer 7 are covered with the p-type-side electrode 11.

Therefore, heat conduction can occur not only from the surface of the p-type InGaAs contact layer 8 to the p-type-side electrode 11 but also from both side surfaces of the p-type InGaAs contact layer 8 and portions of both side surfaces of the p-type InP second cladding layer 7 which are in contact with the p-type-side electrode 11, thereby further improving the heat dissipation of the optical semiconductor device 260. As a result, high-temperature characteristics of the optical semiconductor device 260 are improved.

Embodiment 8

Figure 27:
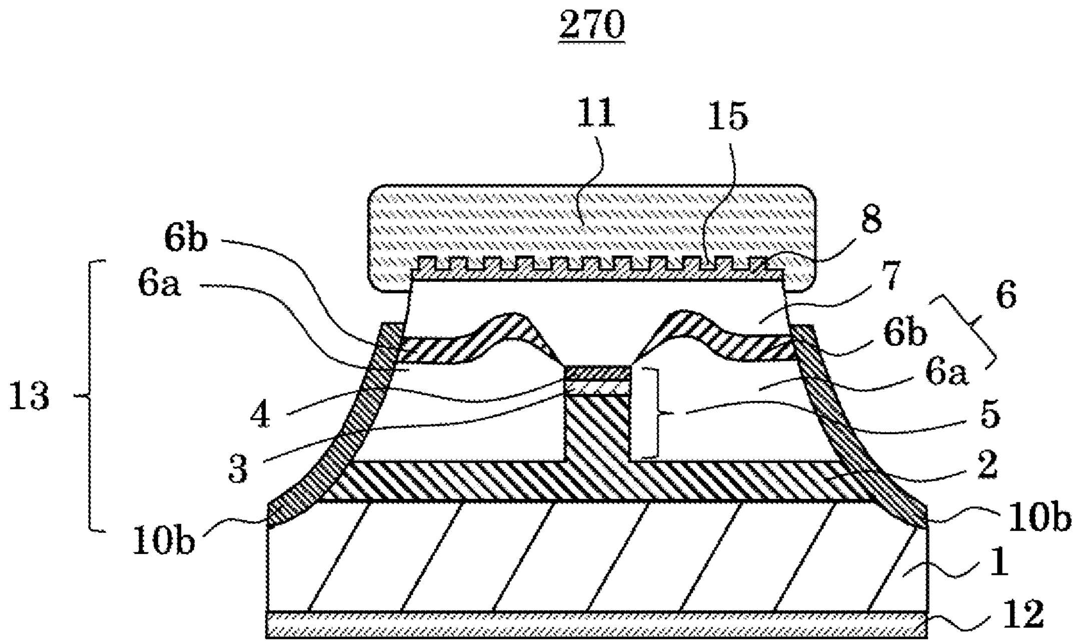
FIG. 27 is a cross-sectional view of a configuration of an optical semiconductor device according to Embodiment 8.

FIG. 27 shows a cross-sectional view of an optical semiconductor device 270 according to Embodiment 8.

The optical semiconductor device 270 according to Embodiment 8 is composed of a stripe-shaped ridge structure 5 formed of an n-type InP cladding layer 2, an active layer 3, and a p-type InP first cladding layer 4 which are sequentially laminated on an n-type InP substrate 1, a buried layer 6 formed of an Fe-doped semi-insulating InP layer 6*a* and an n-type InP block layer 6*b* which are formed on both side surfaces of the stripe-shaped ridge structure 5, a p-type InP second cladding layer 7 which is formed so as to cover a top of the stripe-shaped ridge structure 5 and a surface of the n-type InP block layer 6*b*, a p-type InGaAs contact layer 8 having a concave-convex pattern 15 formed periodically on a surface thereof, a stripe-shaped mesa structure 13 formed of a mesa reaching from the p-type InGaAs contact layer 8 to the n-type InP substrate 1, a partial mesa protective film 10*b* which is made of a $SiO_2$ film and provided on both side surfaces of the stripe-shaped mesa structure 13, one end portion thereof reaching the n-type InP substrate 1 exposed on the both side surfaces, the other end portion thereof covering the buried layer 6 exposed on the both side surfaces, a p-type-side electrode 11 which is formed on the surface of the p-type InGaAs contact layer 8 and covers the both side surfaces of the p-type InGaAs contact layer 8 and a part of the both side surfaces of the p-type second cladding layer 7 which are exposed on the both side surfaces of the stripe-shaped mesa structure 13, and an n-type-side electrode 12 provided on a rear surface side of the n-type InP substrate 1.

The manufacturing method of the optical semiconductor device 270 according to Embodiment 8 will be described below.

The steps of forming the stripe-shaped ridge structure 5 on the n-type InP substrate 1, burying the buried layer 6 formed of the Fe-doped semi-insulating InP layer 6*a* and the n-type InP block layer 6*b* by the MOCVD method so as to cover both side surfaces of the stripe-shaped ridge structure 5, sequentially laminating the p-type InP second cladding layer 7 and the p-type InGaAs contact layer 8 by the MOCVD method, and forming the stripe-shaped mesa structure 13 are the same as those of the method of manufacturing the optical semiconductor device 240 according to Embodiment 5.

The periodic concave-convex pattern 15 is formed on the p-type InGaAs contact layer 8 by dry etching using a $SiO_2$ film (not shown) as an etching mask (concave-convex pattern forming step). Here, the etching mask may be a SiN film, and the periodic concave-convex pattern 15 may be formed by wet etching.

The manufacturing method thereafter is the same as the manufacturing method for the optical semiconductor device 240 according to Embodiment 5.

The optical semiconductor device 270 according to Embodiment 8 is manufactured by the above steps.

By applying the manufacturing method mentioned above to a method in manufacturing the optical semiconductor device 270 according to Embodiment 8, the element resistance is reduced and the heat dissipation is improved. As a result, it becomes possible to easily and reproducibly manufacture the optical semiconductor device 270 with excellent high-temperature characteristics.

In the optical semiconductor device 270 according to Embodiment 8, since the effective surface area of the p-type InGaAs contact layer 8 can be increased by forming the periodic concave-convex pattern 15 on the surface of the p-type InGaAs contact layer 8, heat conduction from the p-type InGaAs contact layer 8 to the p-type-side electrode 11 is further smoothly promoted, thereby further improving heat dissipation performance of the optical semiconductor device 270. In addition, since the contact area between the p-type InGaAs contact layer 8 and the p-type-side electrode 11 can be increased, the element resistance of the optical semiconductor device 270 can be reduced.

In the above description, the periodic concave-convex pattern 15 has been described as an example. However, it is needless to say that the same effect can be obtained even when the concave-convex pattern 15 is formed not periodically but randomly. Further, the cross-sectional shape of the concave-convex pattern 15 may be a groove shape having an acute angle or a groove shape having an obtuse angle, in addition to a rectangular shape.

Further, in FIG. 27, as the direction of the periodic concave-convex pattern 15, the concave-convex pattern 15 which is repeated in the width direction of the stripe-shaped mesa structure 13 is shown. However, even in the concave-convex pattern 15 which is repeated in the direction along the stripe, the same effect is achieved.

In FIG. 27, the periodic concave-convex pattern 15 formed in the p-type InGaAs contact layer 8 is shown as an example, but if the bottom of the periodic concave-convex pattern 15 is formed so as to reach the p-type InP second cladding layer 7, the contact area of the p-type-side electrode 11 is further increased, so that the heat dissipation is further improved.

As mentioned above, in the optical semiconductor device 270 according to Embodiment 8, since the concave-convex pattern 15 is formed on the surface of the p-type InGaAs contact layer 8, heat dissipation performance of the optical semiconductor device 270 is significantly improved, thereby further improving high-temperature characteristics of the optical semiconductor device 270. In addition, since the contact resistance between the p-type InGaAs contact layer 8 and the p-type-side electrode 11 is reduced, the element resistance of the optical semiconductor device 270 can also be reduced.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

- 1 n-type InP substrate (first-conductivity-type semiconductor substrate)
- 2 n-type InP cladding layer (first-conductivity-type cladding layer)
- 3 active layer
- 4 p-type InP first cladding layer (second-conductivity-type first cladding layer)
- 5 ridge structure
- 6 buried layer
- 6*a* Fe-doped semi-insulating InP layer
- 6*b* n-type InP block layer (first-conductivity-type block layer)
- 7 p-type InP second cladding layer (second-conductivity-type second cladding layer)
- 8 p-type InGaAs contact layer (second-conductivity-type contact layer)
- 8*a* contact layer opening
- 9 p-type InP heat dissipation Layer (second-conductivity-type heat dissipation Layer)
- 10 mesa protective film
- 10*a* mesa protective film opening
- 10*b* partial mesa protective film
- 11 p-type-side electrode (second-conductivity-type-side electrode)
- 12 n-type-side electrode (first-conductivity-type-side electrode)
- 13 mesa structure
- 14 high-resistance layer (high-resistance heat dissipation layer)
- 15 concave-convex pattern
- 101 first $SiO_2$ film
- 102 second $SiO_2$ film

103, 105, 106 resist mask

104 third $SiO_2$ film

104*a* opening of third $SiO_2$ film

200, 210, 210 220, 230, 240, 250, 260, 270, 500 optical semiconductor device

The invention claimed is:

1. An optical semiconductor device comprising:

a stripe-shaped ridge structure including a first-conductivity-type cladding layer, an active layer, and a second-conductivity-type first cladding layer which are sequentially laminated on a first-conductivity-type substrate;

a buried layer which is buried on both side surfaces of the ridge structure to cover thereof;

a second-conductivity-type second cladding layer and a second-conductivity-type contact layer which are sequentially laminated on a top of the ridge structure and a surface of the buried layer;

a stripe-shaped mesa structure which is centered on the ridge structure and formed of a mesa reaching from the second-conductivity-type contact layer to the first-conductivity-type semiconductor substrate, both side surfaces of the mesa structure being formed by the mesa;

a heat dissipation layer which is provided on a surface of the second-conductivity-type contact layer and has a narrower width than the second-conductivity-type contact layer;

a mesa protective film which is made of an insulating film and covers the both side surfaces of the mesa structure and both end portions of the surface of the second-conductivity-type contact layer; and a second-conductivity-type-side electrode which is electrically connected to the second-conductivity-type contact layer.

2. The optical semiconductor device according to claim 1, wherein the heat dissipation layer is formed of a second-conductivity-type semiconductor layer.

3. The optical semiconductor device according to claim 1, wherein the heat dissipation layer is formed of a high-resistance layer.

4. An optical semiconductor device comprising:

a stripe-shaped ridge structure including a first-conductivity-type cladding layer, an active layer, and a second-conductivity-type first cladding layer which are sequentially laminated on a first-conductivity-type substrate;

a buried layer which is buried on both side surfaces of the ridge structure to cover thereof;

a second-conductivity-type second cladding layer and a second-conductivity-type contact layer which are sequentially laminated on a top of the ridge structure and a surface of the buried layer;

a stripe-shaped mesa structure which is centered on the ridge structure and formed of a mesa reaching from the second-conductivity-type contact layer to the first-conductivity-type semiconductor substrate, both side surfaces of the mesa structure being formed by the mesa;

a heat dissipation layer which is formed on a surface of the second-conductivity-type second cladding layer through a contact layer opening provided in the second-conductivity-type contact layer;

a mesa protective film which is made of an insulating film and covers the both side surfaces of the mesa structure and both end portions of a surface of the second-conductivity-type contact layer; and a second-conductivity-type-side electrode which is electrically connected to the second-conductivity-type contact layer.

5. An optical semiconductor device comprising:

a stripe-shaped ridge structure including a first-conductivity-type cladding layer, an active layer, and a second-conductivity-type first cladding layer which are sequentially laminated on a first-conductivity-type substrate;

a buried layer which is buried on both side surfaces of the ridge structure to cover thereof;

a second-conductivity-type second cladding layer and a second-conductivity-type contact layer which are sequentially laminated on a top of the ridge structure and a surface of the buried layer;

a stripe-shaped mesa structure which is centered on the ridge structure and formed of a mesa reaching from the second-conductivity-type contact layer to the first-conductivity-type semiconductor substrate, both side surfaces of the mesa structure being formed by the mesa;

a partial mesa protective film which is made of an insulating film and provided on both side surfaces of the mesa structure, one end portion of the partial mesa protective film reaching the first-conductivity-type semiconductor substrate exposed on the both side surfaces of the mesa structure, the other end portion of the partial mesa protective film covering at least the buried layer exposed on the both side surfaces of the mesa structure; and a second-conductivity-type-side electrode which is formed so as to cover a surface of the second-conductivity-type contact layer and to cover directly, at both end portions thereof, both side surfaces of the second-conductivity-type contact layer exposed on the both side surfaces of the mesa structure, and at least portions of the both side surfaces of the second-conductivity-type second cladding layer exposed on the both side surfaces of the mesa structure.

6. The optical semiconductor device according to claim 5, wherein the both end portions of the second-conductivity-type-side electrode are formed so as to cover the other end portions of the partial mesa protective film.

7. The optical semiconductor device according to claim 5, wherein at least part of an upper end portion of the second-conductivity-type second cladding layer has a shape such that a width thereof widens in a lamination direction in a cross section perpendicular to a stripe direction.

8. The optical semiconductor device according to claim 5, wherein at least part of an upper end portion of the second-conductivity-type second cladding layer has a shape such that a width thereof narrows in a lamination direction in a cross section perpendicular to a stripe direction.

9. The optical semiconductor device according to claim 8, wherein the second-conductivity-type contact layer has a shape such that a width thereof narrows in the lamination direction in the cross section perpendicular to the stripe direction.

10. The optical semiconductor device according to claim 5, wherein a concave-convex pattern is formed on the surface of the second-conductivity-type contact layer.

11. The optical semiconductor device according to claim 10, wherein the concave-convex pattern is periodically provided.

12. The optical semiconductor device according to claim 5, wherein the second-conductivity-type-side electrode is directly on the at least portions of the both side surfaces of the second-conductivity-type second cladding layer exposed on the both side surfaces of the mesa structure.

* * * * *